United States Patent
Omi et al.

(10) Patent No.: US 8,269,717 B2
(45) Date of Patent: *Sep. 18, 2012

(54) PHOTODETECTION DEVICE AND IMAGE DISPLAY DEVICE

(75) Inventors: Toshihiko Omi, Chiba (JP); Taro Nakata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/819,849

(22) Filed: Jun. 21, 2010

(65) Prior Publication Data

US 2010/0253616 A1  Oct. 7, 2010

Related U.S. Application Data

(63) Continuation of application No. PCT/JP2008/073520, filed on Dec. 25, 2008.

(30) Foreign Application Priority Data

Dec. 25, 2007 (JP) .................................. 2007-332335
Dec. 22, 2008 (JP) .................................. 2008/325516

(51) Int. Cl.
    *G09G 3/36* (2006.01)
(52) U.S. Cl. ......................................... 345/102; 345/82
(58) Field of Classification Search .................... 345/87, 345/102; 349/65
    See application file for complete search history.

(56) References Cited

U.S. PATENT DOCUMENTS

| 2005/0035273 A1 | 2/2005 | Machida et al. |
| 2005/0087825 A1 | 4/2005 | Cok |
| 2009/0160830 A1* | 6/2009 | Omi et al. ..................... 345/204 |
| 2009/0184331 A1* | 7/2009 | Omi et al. ........................ 257/80 |

FOREIGN PATENT DOCUMENTS

| CN | 1543186 A | 11/2004 |
| JP | 01-207640 A | 8/1989 |
| JP | 08-116044 A | 5/1996 |
| JP | 08-330560 A | 12/1996 |
| JP | 09-229769 A | 9/1997 |
| JP | 2005-229353 A | 8/2005 |

OTHER PUBLICATIONS

International Search Report for International Application No. PCT/JP2008/073520, dated Mar. 31, 2009, 3 pages.
European Search Report for European Application No. 08 86 4960, dated Jan. 19, 2012, 12 pp.

* cited by examiner

*Primary Examiner* — Ricardo L Osorio
(74) *Attorney, Agent, or Firm* — Brinks Hofer Gilson & Lione

(57) ABSTRACT

Provided is a photodetection device which is small in size and has excellent sensitivity. The photodetection device (10) puts cathode terminals of photodiodes (1 and 2) having different spectral characteristics, or a photodiode (1) provided with an optical filter and a photodiode (2) provided with a light shield layer, into an open end state, and detects light intensity of a desired wavelength region according to a difference in electric charges that have been stored in those photodiodes in a given period of time. Since the photodiodes 1 and 2 store electric charges, even if a photocurrent is small, it is possible to store the photocurrent to obtain the electric charges required for detection, permitting achievement of downsizing and high detection performance of the semiconductor device on which the photodiodes 1 and 2 are formed. It is also possible to realize a wide dynamic range by making the electric charge storage time variable according to the light intensity, to suppress electric power consumption by intermittently driving an element required for differential detection at the time of differential detection, and to reduce an effect from flicker by averaging the output.

8 Claims, 19 Drawing Sheets

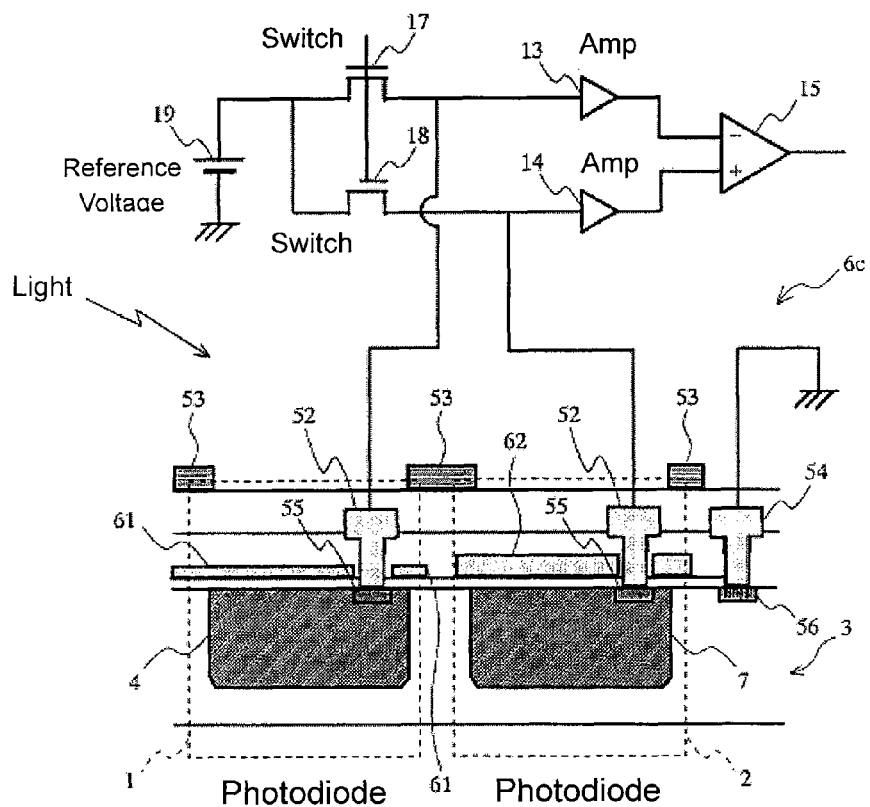
FIG. 10A
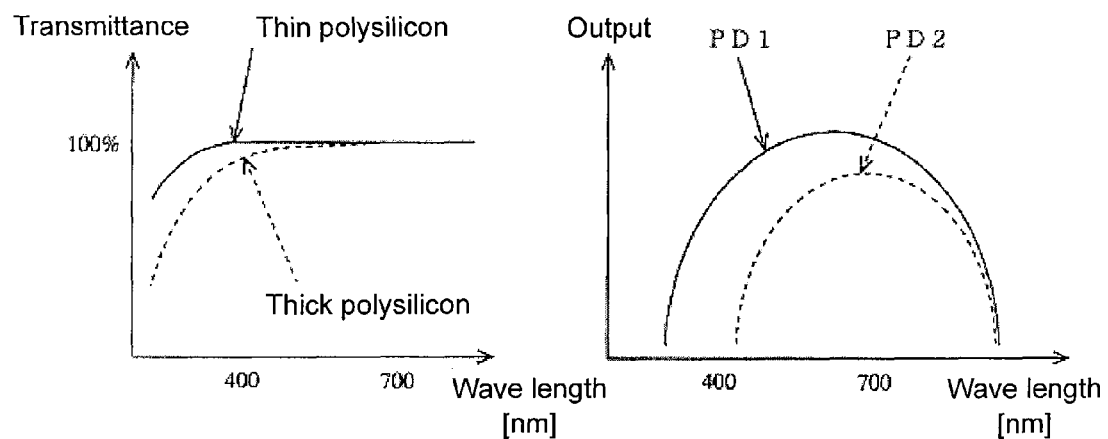
FIG. 10B  FIG. 10C

PHOTODETECTION DEVICE AND IMAGE DISPLAY DEVICE

RELATED APPLICATIONS

This application is a continuation of PCT/JP2008/073520 filed on Dec. 25, 2008, which claims priority to Japanese Application Nos. 2007-332335 filed on Dec. 25, 2007 and 2008-325516 filed on Dec. 22, 2008. The entire contents of these applications are incorporated herein by reference.

BACKGROUND OF THE INVENTION

1. Field of the Invention

The present invention relates to a photodetection device and an image display device, and for example, relates to a device for measuring illuminance of the outside through a light receiving element.

2. Description of the Related Art

Controlling an object based on a measurement of the illuminance of the outside through an illuminance meter is carried out such as, for example, for adjusting a brightness of a backlight of a liquid crystal display or turning on streetlights automatically.

Such illuminance meter uses a light receiving element to convert the intensity of received light (light intensity) into a current corresponding to the light intensity.

Since silicon (Si), which is a material for a light receiving element, has, however, a sensitivity peak in an infrared light region, in order to obtain enough sensitivity to a light in a predetermined wavelength region, for example, to a visible light or an ultraviolet light two light receiving elements having different spectral characteristics, which makes difference in the wavelength region and which cancels outputs in other regions, are combined to obtain a desired spectral characteristic.

An appropriate combination of the light receiving elements different in spectral characteristic enables realization of a spectral characteristic close to a human eye for detection of a visible light, and, detection of an ultraviolet light.

As an art for obtaining the desired spectral characteristic by combining the two light receiving elements together as described above, there is proposed a "semiconductor photodetection device" disclosed in Patent Document 1.

Patent Document 1: JP H01-207640 A

In this art, two n-type layers different in depth are formed on a p-type substrate to form two photodiodes different in spectral characteristic, and a difference in current between those photodiodes is taken to detect light in an ultraviolet region.

SUMMARY OF THE INVENTION

In the conventional art, however, it is necessary to increase the current for the light receiving element in order to increase the SN ratio to improve sensitivity. Accordingly the light receiving element itself is required to have a large size.

When the light receiving element becomes larger, there is a problem that it is difficult to reduce a sensor size because an IC chip on which the light receiving element is formed also increases in size.

An object of the present invention is therefore to provide, for example, a photodetection device which is small in size and has excellent sensitivity.

In order to achieve the above-mentioned object of the present invention, the present invention as disclosed in claim 1 provides a photodetection device including: a light receiving element for generating an electric charge based on incident light; storage means for causing the light receiving element to store the generated electric charge; and output means for outputting an amount of the electric charge corresponding to the incident light having a desired wavelength, which is stored in the storage means.

The present invention as disclosed in claim 2 provides a photodetection device according to claim 1, in which: the photodetection device includes light shield means for blocking light other than the incident light having the desired wavelength, which is incident on the light receiving element; and the output means outputs the amount of the electric charge stored in the storage means as the amount of the electric charge corresponding to the incident light having the desired wavelength.

The present invention provides a photodetection device in which the storage means causes a predetermined electrode of the light receiving element to be electrically opened, to store the electric charge.

The present invention provides a photodetection device in which: the predetermined electrode of the light receiving element is connected, through a predetermined switch, to a constant voltage source for resetting the electric charge stored in the light receiving element; and the storage means turns off the predetermined switch to electrically open the predetermined electrode.

The present invention provides a photodetection device in which the photodetection device includes reset means for resetting the electric charge stored in the light receiving element by connecting the predetermined electrode of the light receiving element to a predetermined constant voltage source.

The present invention provides a photodetection device in which: the light receiving element includes a first light receiving element including a first light shield means for blocking incident light other than the incident light having the desired wavelength, and a second light receiving element including a second light shield means for blocking incident light; the storage means causes the first light receiving element and the second light receiving element to store the generated electric charges; and the output means includes differential acquisition means for acquiring a differential between amounts of the electric charges stored in the first light receiving element and the second light receiving element and outputs the differential as the amount of the electric charge corresponding to the incident light having the desired wavelength.

The present invention provides a photodetection device in which the first light receiving element and the second light receiving element have the same light-receiving and electric charge-storage characteristics.

The present invention provides a photodetection device in which the light receiving element includes a first light receiving element, and a second light receiving element having a spectral characteristic different from a spectral characteristic of the first light receiving element; the storage means causes the first light receiving element and the second light receiving element to store the generated electric charges; and the output means includes differential acquisition means for acquiring a differential between amounts of the electric charges stored in the first light receiving element and the second light receiving element and outputs the differential as the amount of the electric charge corresponding to the incident light having the desired wavelength.

The present invention provides a photodetection device including: a first light receiving element for generating an electric charge based on received light; a second light receiving element having a spectral characteristic different from a spectral characteristic of the first light receiving element, for generating an electric charge based on received light; storage means for causing the first light receiving element and the second light receiving element to store the generated electric charges; differential acquisition means for acquiring a differential between the electric charges stored in the first light receiving element and the second light receiving element; and differential output means for outputting the acquired differential.

The present invention provides a photodetection device in which the storage means causes predetermined electrodes of the first light receiving element and the second light receiving element to be electrically opened, to store the electric charges.

The present invention provides a photodetection device in which: the predetermined electrodes of the first light receiving element and the second light receiving element are connected, through predetermined switches, to a constant voltage source for resetting the electric charges stored in the light receiving elements; and the storage means turns off the predetermined switches to electrically open the predetermined electrodes.

The present invention provides a photodetection device in which the differential acquisition means acquires the differential between the stored electric charges based on a voltage difference between the predetermined electrodes of the first light receiving element and the second light receiving element.

The present invention provides a photodetection device in which the photodetection device includes reset means for resetting the electric charges stored in the first light receiving element and the second light receiving element by connecting the predetermined electrodes of the first light receiving element and the second light receiving element to a predetermined constant voltage source.

The present invention provides a photodetection device in which the photodetection device includes driving means for driving the differential acquisition means at a timing at which the differential is output from the differential output means may be provided.

The present invention provides a photodetection device in which the photodetection device includes reduction means for reducing a variation in the differential output from the differential output means, which is caused by a variation in intensity of light emitted from a light source.

The present invention provides a photodetection device in which the photodetection device includes changing means for changing electric charge storage time of the storage means based on intensity of light.

The present invention provides an image display device including: the photodetection device; image display means for displaying an image; brightness determination means for determining brightness of an outside world based on an output from the photodetection device; and luminance adjustment means for adjusting luminance of the image display means based on the determined brightness.

According to the present invention, for example, a photodetection device which is small in size and has excellent sensitivity may be provided.

BRIEF DESCRIPTION OF THE DRAWINGS

FIG. 10A is a diagram illustrating a structure of a semiconductor device according to yet another embodiment.

FIG. 10B is a schematic graph illustrating attenuation of light by polysilicon having different thickness.

FIG. 10C is a schematic graph illustrating spectral characteristics of the photodiodes.

DETAILED DESCRIPTION OF THE PREFERRED EMBODIMENTS (1) Outline of Embodiments (Embodiment of Photodetection Device)
In a photodetection device 10 (FIG. 3) cathode terminals of photodiodes 1 and 2 having different spectral characteristics are kept in an open end state to detect light intensity of a desired wavelength region according to a difference in electric charges stored in those photodiodes in a given period of time; the photodiode 1 provided with an optical filter and the photodiode 2 provided with a shield layer.

Since the photodiodes 1 and 2 store electric charges, even if a photocurrent is small, it is possible to store the photocurrent to obtain the electric charges required for detection, permitting achievement of downsizing and high detection performance of the semiconductor device on which the photodiodes 1 and 2 are formed.

It is also possible to realize a wide dynamic range by making the electric charge storage time variable according to the light intensity, to suppress electric power consumption by intermittently driving an element required for differential detection at the time of differential detection, and to reduce an effect from flicker by averaging the output.

(Embodiment of Photodetection Semiconductor Device)

Figure 8A:
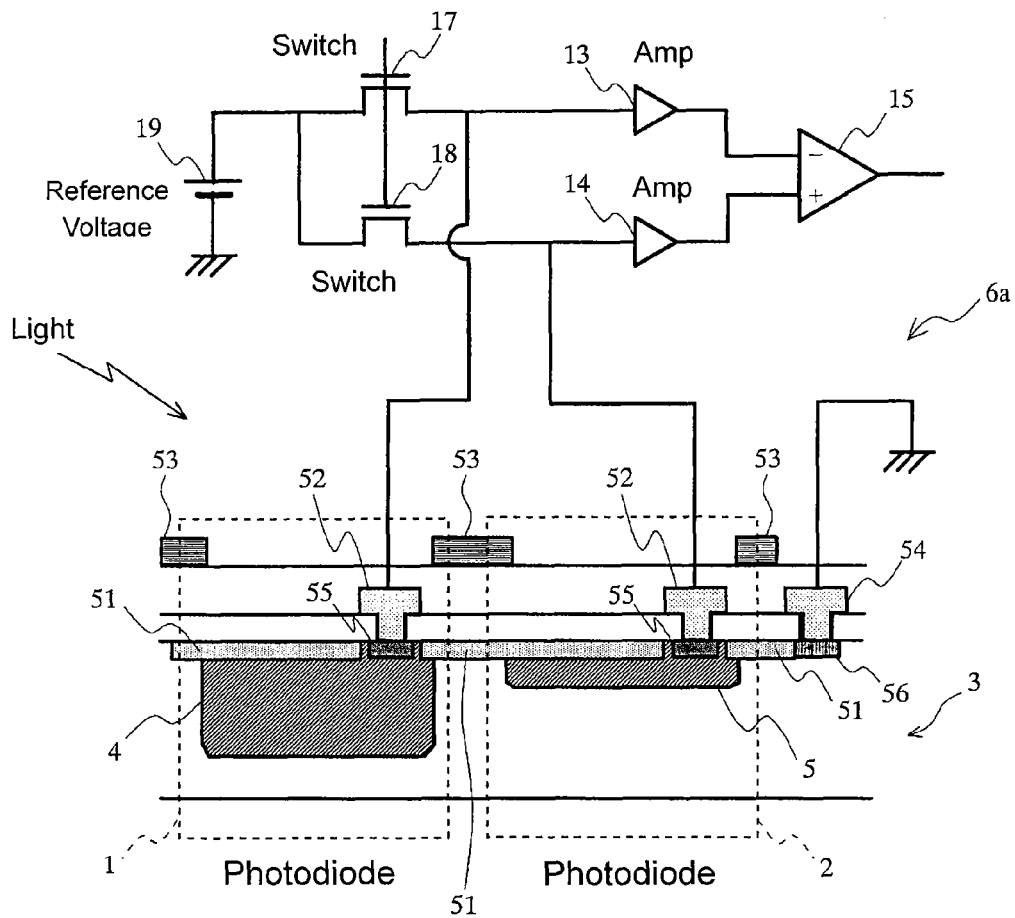
FIG. 8A is a diagram illustrating a structure of a semiconductor device according to another embodiment.
Figure 8B:
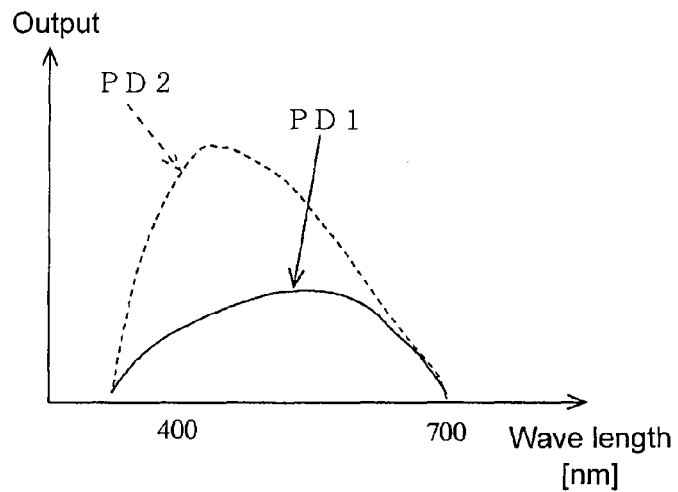
FIG. 8B is a schematic graph illustrating spectral characteristics of the photodiodes.

A shield transmittant to a light to be detected and electrically conductive is disposed on the light receiving surfaces of the photodiodes 1 and 2 (FIG. 8(*a*)), to thereby suppress the induction of electric charges in the photodiodes 1 and 2 caused by the electromagnetic wave entering from outside.

Further, two kinds of filters (FIG. 10(*a*)) whose light transmittance depends on the wavelength are disposed on the light receiving surfaces of the photodiodes 1 and 2, respectively, to thereby set a difference between the spectral characteristics thereof.

The shield and the filter may be formed of, for example, polysilicon or a semiconductor thin film having a predetermined conductivity to incorporate the manufacturing processes therefor into the semiconductor manufacturing process so that the shield and the filter may be easily manufactured.

(Embodiment of Digital Output Photodetection Circuit)

The amount of electric charges stored in the photodiodes 1 and 2 is associated with clocks to generate a count value corresponding to the amount of electric charges, to thereby convert the amount of stored electric charges into a digital value.

Figure 14A:
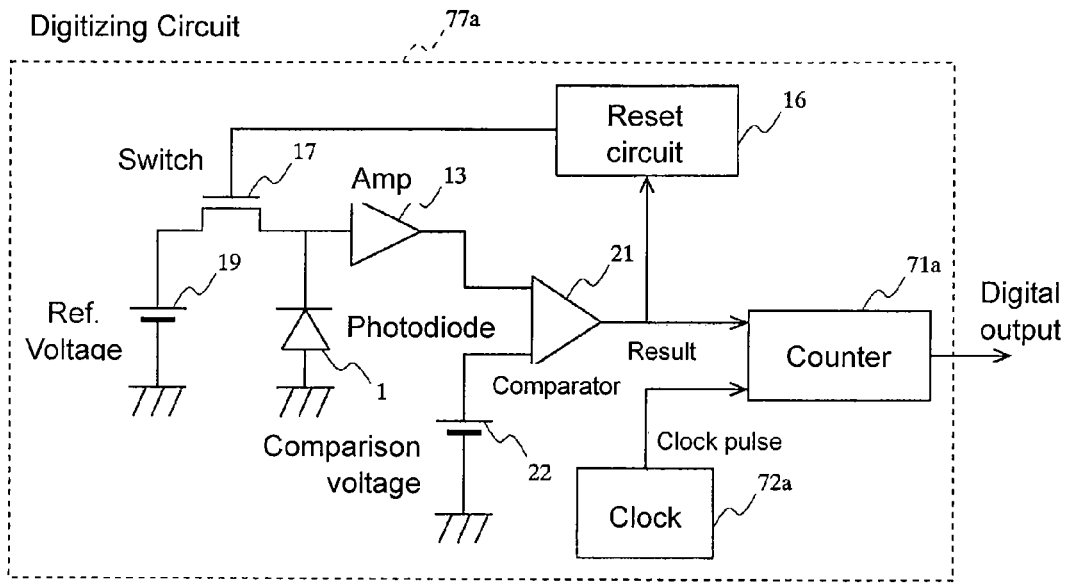
FIG. 14A is a diagram illustrating a configuration of a digitizing circuit according to another embodiment.
Figure 14B:
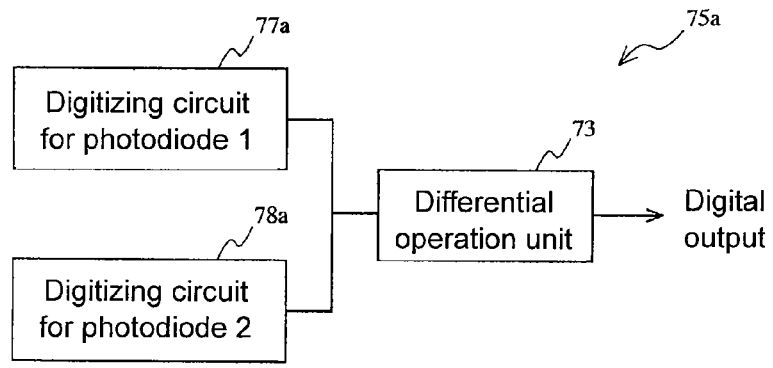
FIG. 14B is a diagram illustrating a configuration of a digital output photodetection circuit according to another embodiment.

To achieve the above-mentioned operation, there may be employed a system of counting the number of clock pulses until the stored electric charges change by a predetermined amount (FIGS. 12A and 12B), and a system of counting the number of times the storage and reset of electric charges is repeated by the photodiodes 1 and 2 within a predetermined reference pulse period (FIGS. 14A and 14B).

Then, the digitized outputs of the photodiodes 1 and 2 are calculated so as to output the difference in a digital value.

In the above-mentioned system, the digital value may be obtained by using a simple mechanism such as a counter or a clock, and there is no necessity of using a complicated logic such as an A/D converter.

(2) Details of Embodiments

Embodiments of the present invention are roughly classified into "photodetection device", "photodetection semiconductor device", and "digital output photodetection circuit", and described below in this order.

In the following description, a description is given using photodiodes as light receiving elements, but other elements such as phototransistors can also be employed.

(Embodiments of Photodetection Device)

A conventional photodetection device uses a difference between currents generated in photodiodes to measure the light intensity. However, in order to improve the signal-to-noise (SN) ratio and obtain a sufficient sensitivity, it is necessary to increase the current in the light receiving element, and accordingly an area of the light receiving element needs to be increased.

For this reason, improvement for the sensitivity increases the size of a semiconductor device and an IC chip on which the semiconductor device is formed, leading to such a problem that downsizing of the sensor is difficult.

In view of the above-mentioned circumstances, the embodiment employs a system in which the electric charges generated in the photodiodes are stored for a given period of time, and the stored electric charges are amplified by an amplifier to take a differential therebetween.

Figure 1:
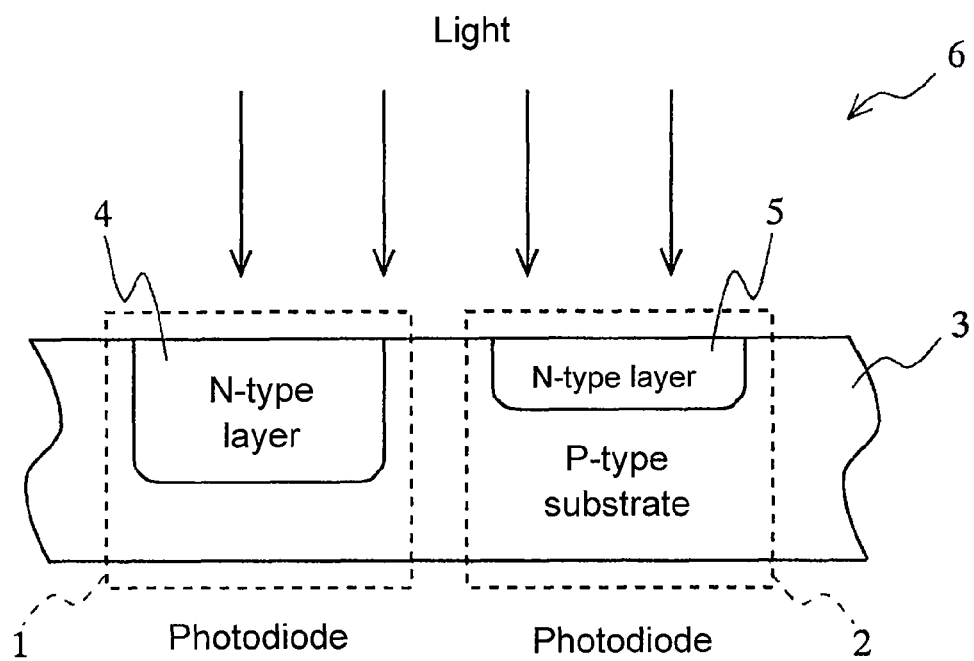
FIG. 1 is a diagram illustrating an example of a structure of a semiconductor device in which photodiodes are formed.

FIG. 1 is a diagram illustrating an example of a semiconductor device in which photodiodes used in this embodiment are formed.

A semiconductor device 6 is made of, for example, single crystal silicon, and includes a p-type substrate 3 that is formed in p-type, and n-type layers 4 and 5 which are n-type regions.

The n-type layers 4 and 5 are formed with predetermined depths from a front surface of the p-type substrate 3, and the n-type layer 4 is formed so as to reach a position deeper than the n-type layer 5.

Then, the n-type layer 4 and the p-type substrate 3 constitute a photodiode 1, and the n-type layer 5 and the p-type substrate 3 constitute a photodiode 2, When light is input to a light receiving surface (front surface) of the semiconductor device 6, electrons and holes are generated in a p-n junction by the aid of a light energy, and hence an output thereof may be obtained as a voltage or a current.

The light passes through the n-type layer until the light reaches the p-n junction after entering the light receiving surface. However, the light transmittance of the n-type layer depends on the light wavelength and the thickness of the n-type layer, and hence the photodiodes 1 and 2 exhibit different spectral characteristics.

Here, the "spectral characteristic" means a correspondence relationship (dependency relationship) between the outputs of the photodiodes and the wavelength of the incident light, which may be also called "spectral sensitivity" or "spectral sensitivity characteristic".

As described above, the photodiode 1 functions as a first light receiving element that generates an electric charge by the received light, and the photodiode 2 functions as a second light receiving element that generates an electric charges by the received light and has a spectral characteristic different from that of the first light receiving element.

Figure 2:
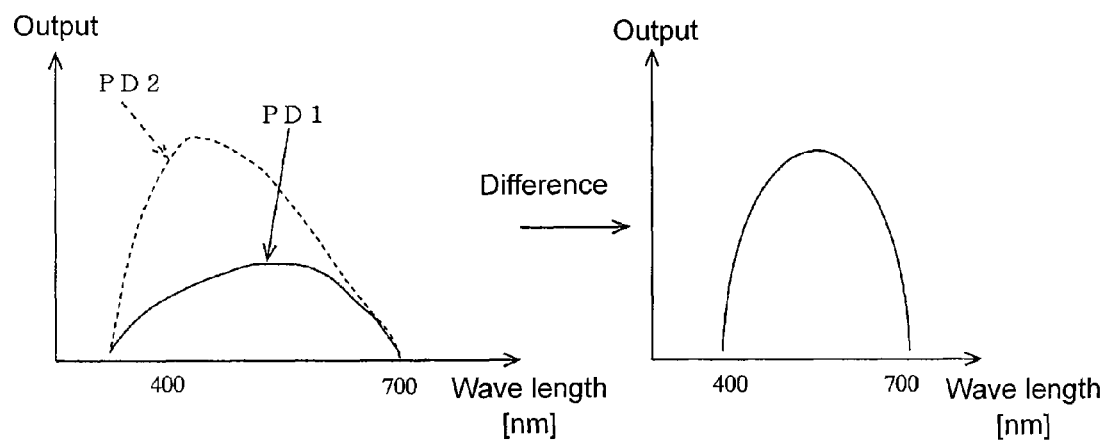
FIG. 2 is a graph schematically illustrating a spectral characteristic of the photodiodes.

FIG. 2 is a graph schematically illustrating the spectral characteristics of the photodiode 1(PD1) and the photodiode 2(PD2). FIG. 2 is a schematic graph for illustrating the concept, and therefore does not necessarily strictly illustrate the spectral characteristics.

The axis of ordinate represents an output (current, voltage, or the like) which is generated by the photodiodes, and the axis of abscissa represents the wavelength of incident light. It is assumed that the light intensity of incident light is constant.

In this example, a peak wavelength of the spectral sensitivity characteristic of the photodiode 2 is positioned on a shorter wavelength side than that of the photodiode 1, the sensitivity at the peak wavelength of the photodiode 2 is made larger than that of the photodiode 1, and the sensitivity in an infrared region (region longer than about 700 [nm] in wavelength) of the photodiode 2 is identical with that of the photodiode 1.

For this reason, when a difference between those photodiodes 1 and 2 is taken, the outputs in the infrared region are canceled, and hence the sensitivity of the visible light region may be obtained.

The spectral characteristics of the photodiodes 1 and 2 may be individually adjusted by the thicknesses of the n-type layers or the like, and hence the spectral characteristics of the photodiodes 1 and 2 may be appropriately determined so as to take a difference between those outputs, to thereby obtain a desired spectral characteristic.

Figure 3:
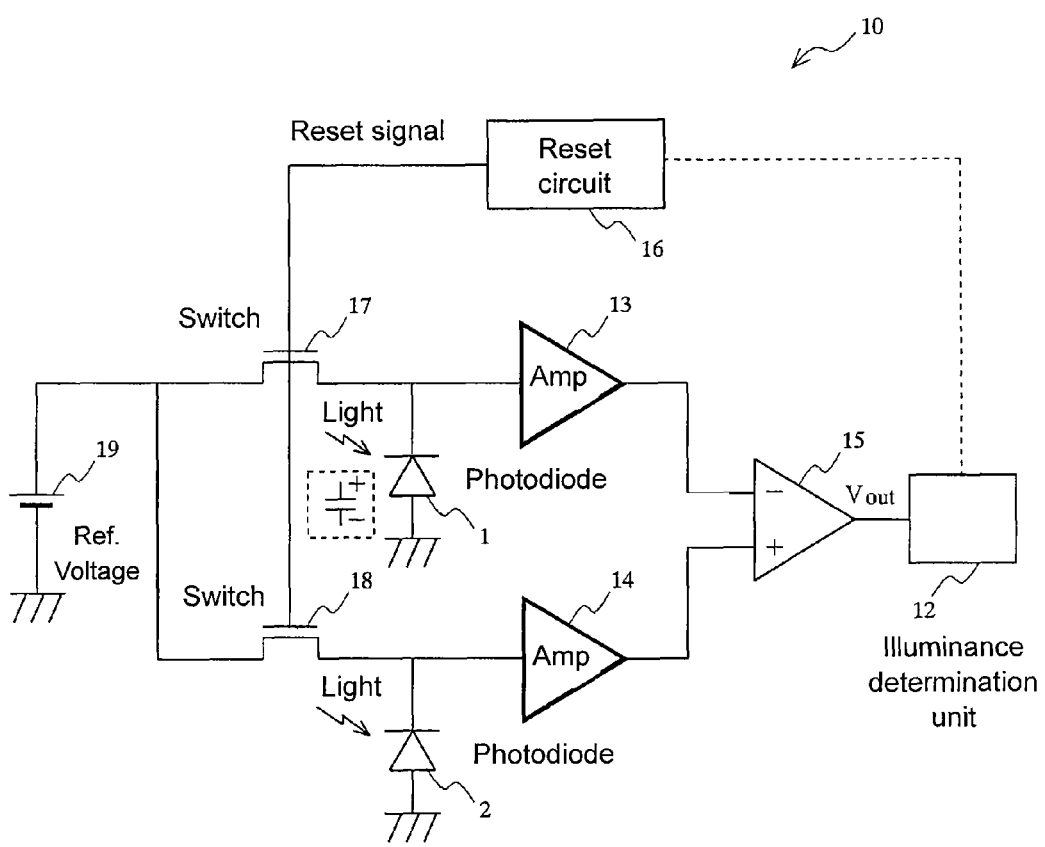
FIG. 3 is a diagram for illustrating a configuration of a photodetection device.

FIG. 3 is a diagram for illustrating a configuration of the photodetection device 10 according to this embodiment.

The photodetection device 10 is employed, for example, as an illumination meter for measuring illuminance of the outside world, which is used for adjusting the luminance of a backlight for a liquid crystal display screen of a cellular phone.

The photodiodes 1 and 2 are photodiodes that are different in spectral characteristic from each other, and are configured such that differences between the outputs show a spectral characteristic similar to the spectral characteristic of the naked eye.

An anode terminal of the photodiode 1 is grounded, and a cathode terminal thereof is connected to an amplifier 13 and also connected to a direct-current voltage source 19 through a switch 17.

The switch 17 is formed of a switching element such as a transistor, and turns on/off the connection of the photodiode 1 and the direct-current power supply 19 according to a reset signal from a reset circuit 16.

The amplifier 13 is configured by an amplifier circuit such as an operational amplifier, and detects and amplifies a voltage at the cathode terminal of the photodiode 1 to output the voltage to a differential circuit 15.

The amplifier 13 has, for example, an input impedance of infinity so as to prevent a current from flowing from the photodiode 1, and is capable of amplifying the current without affecting a voltage developed in the photodiode 1.

The direct-current power supply 19 is formed of, for example, a constant voltage circuit, and sets the cathode terminal of the photodiode 1 to a reference voltage when the switch 17 turns on.

On the other hand, when the switch 17 turns off, the cathode terminal is electrically put into an open end state (floating state), and an electric charge corresponding to the light intensity is stored in the photodiode 1.

In this case, the photodiode 1 has been biased in the reverse direction by means of the direct-current power supply 19, and hence the voltage at the cathode terminal decreases due to electrons generated in the photodiode 1.

As described above, the amount of the electric charge that has been stored in the photodiode 1 may be detected as a voltage. Then, the rate of voltage decrease is inversely proportional to a rate at which electrons are generated, that is, the light intensity.

When the switch 17 again turns on, the electric charge that has been stored in the photodiode 1 is reset to an initial state, and the voltage at the cathode terminal becomes a reference voltage.

A switch 18, the photodiode 2, and an amplifier 14 are identical in configuration with the switch 17, the photodiode 1, and the amplifier 14, respectively.

The reset circuit 16 transmits the reset signal to switches 17 and 18 at regular intervals, and turns on/off the switches 17 and 18 at the same time.

Then, upon turning on the switches 17 and 18, the reset circuit 16 resets the voltages at the cathode terminals of the photodiodes 1 and 2 to the reference voltage (that is, resets the electric charges that have been stored in the photodiodes 1 and 2 to an initial value), and turns off the switches 17 and 18, to thereby store the electric charges in the photodiodes 1 and 2.

As described above, the reset circuit 16 and the switches 17 and 18 function as storage means for putting the terminals of the first light receiving element and the second light receiving element into the open end state so as to store the electric charges that are generated in the light receiving elements, and also function as reset means for connecting predetermined electrodes (cathode terminals in this case) of the first light receiving element and the second light receiving element to a predetermined constant voltage source (direct-current power supply 19) so as to reset the electric charges that have been stored in the light receiving element.

The differential circuit 15 receives the voltages that have been output from the amplifier 13 and the amplifier 14, generates a difference therebetween, and outputs the difference to an illuminance determination unit 12.

As described above, the differential circuit 15 functions as differential acquisition means for acquiring a differential between the electric charges that have been stored in the first light receiving element (photodiode 1) and the second light receiving element (photodiode 2), and also functions as differential output means for outputting the acquired differential (to the illuminance determination unit 12).

Further, the differential circuit 15 acquires a difference in the stored electric charges therebetween, based on a voltage difference between the predetermined electrodes (between cathode terminals) of the first light receiving element (photodiode 1) and the second light receiving element (photodiode 2).

The illuminance determination unit 12 samples and acquires (for example, immediately before reset) a difference of the voltage which is output from the differential circuit 15 in synchronism with the reset signal of the reset circuit 16, and determinates the illuminance.

The illuminance determination unit 12 stores, for example, a correspondence between the difference and the illuminance, to thereby allow the illuminance of the outside world to be determined.

The illuminance determination unit 12 functions as brightness determination means for determining the brightness of the outside world by the aid of the output of the photodetection device 10 (in this example, a configuration of the photodetection device 10 except for the illuminance determination unit 12).

Further, although not shown, the illuminance determination unit 12 is connected to, for example, a luminance adjustment unit for adjusting the luminance of a backlight of the liquid crystal display device, and the luminance adjustment unit is configured to adjust the luminance of the backlight of the liquid crystal display device according to the determination result of the illuminance determination unit 12.

In this example, the liquid crystal display device functions as image display means for displaying an image, and the luminance adjustment unit functions as luminance adjustment means for adjusting the luminance of the image display means according to the brightness determined by the illuminance determination unit 12.

The operation of the photodetection device 10 configured as described above is described.

First, an operation of the photodiode 1 is described.

When the reset circuit 16 turns on the switch 17, the cathode terminal of the photodiode 1 becomes the reference voltage due to the direct-current power supply 19, and the electric charge that has been stored in the photodiode 1 is reset to the initial value.

Subsequently, when the reset circuit 16 turns off the switch 17, the photodiode 1 is disconnected from the direct-current power supply 19, and, due to the input impedance of the amplifier 13 being infinite, the cathode terminal is put into an open end state in which the cathode terminal is electrically disconnected from the circuit.

In this case, as illustrated in the dashed-line box in the figure, the photodiode 1 has a p-n junction surface operating as a capacitor, and stores an electric charge generated by light.

Then, because the photodiode 1 has been biased in the reverse direction by the direct-current power supply 19, the voltage at the cathode terminal decreases at a rate corresponding to the light intensity due to the electric charge stored in the photodiode 1.

Figure 13:
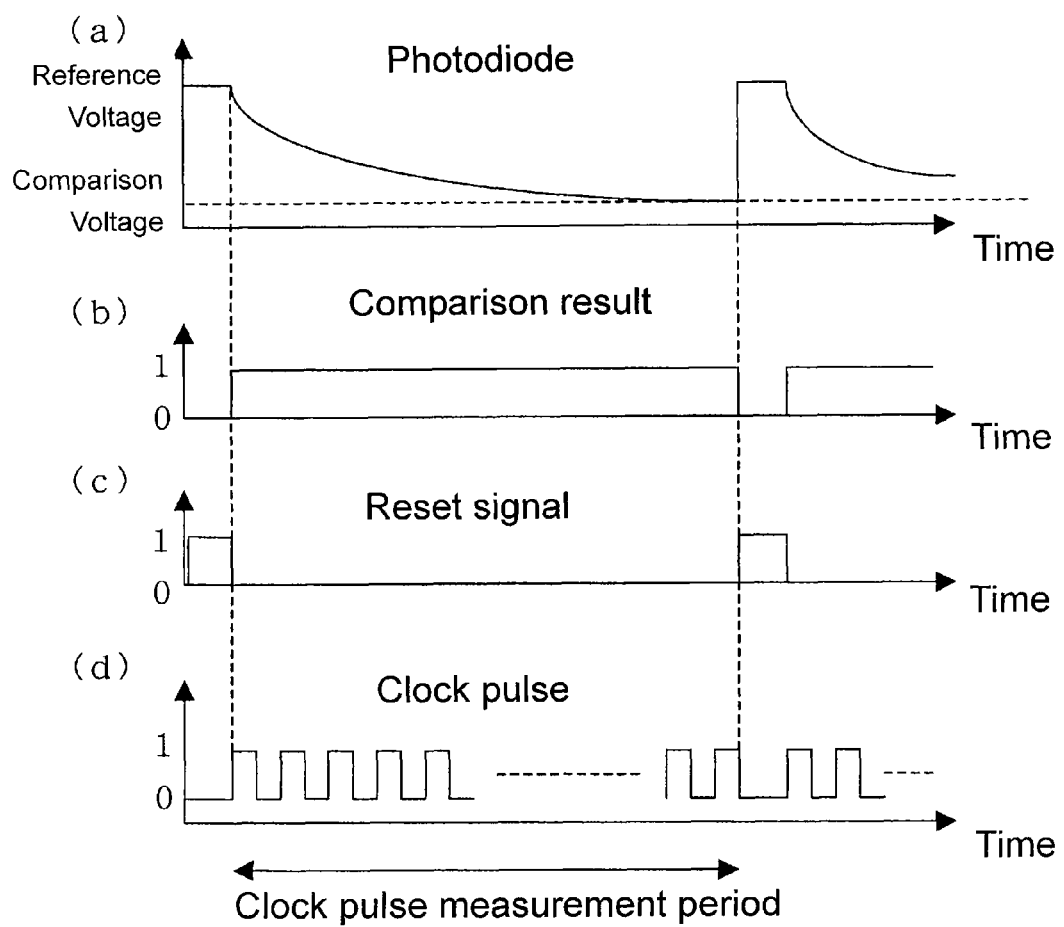
FIGS. 13(a)-13(d) are timing charts of the digitizing circuit.

The reset circuit 16 repeats the on/off operation of the switch 17, and hence the voltage at the cathode terminal of the photodiode 1 repeats a state of the reference voltage (electric charge reset), the voltage reduction (electric charge storage), the reference voltage (electric charge reset), ... , in the stated order, which is illustrated in FIG. 13(*a*).

Similarly, the photodiode 2 repeats a state of the reference voltage, the voltage reduction, the reference voltage, ... , in the stated order in synchronism with the photodiode 1. However, the photodiodes 1 and 2 are different in spectral characteristic and hence the voltages decrease at different rates.

For this reason, when a difference between those outputs is taken by the differential circuit 15 after the outputs of the photodiodes 1 and 2 have been amplified, the difference becomes equal to a difference between the electric charges that have been stored in the photodiodes 1 and 2, that is, a value corresponding to the illuminance.

Thus, when the illuminance determination unit 12 detects the output of the differential circuit 15 after a lapse of a predetermined time from reset (for example, immediately before the subsequent reset), the illuminance determination unit 12 may detect the difference between the electric charges that have been stored in the photodiodes 1 and 2 from reset to detection as a voltage difference. As a result, it is possible to determine the illuminance.

As described above, in the photodetection device 10, the outputs of the two light receiving elements (photodiodes 1 and 2) different in spectral characteristic are connected to the input of the amplifier, and the light receiving elements may be put into a floating state.

Further, the photodetection device 10 has a mechanism for resetting the electric charges of the light receiving element at given cycles by using the direct-current power supply 19 and the reset circuit 16, and a system for storing the electric charges in the light receiving element at given cycles, and outputting a difference of the signals that are amplified by the amplifiers with the above-mentioned mechanism.

Then, the output difference between the voltages of the two light receiving elements different in spectral characteristic is obtained, to thereby obtain the desired spectral characteristic.

An input voltage Vin of the amplifier is determined by an expression of Vin=Q/C on the basis of a total capacity C of the light receiving element and an electric charge Q that is generated by the light illuminance. Therefore, by reducing the capacity of the light receiving element, the sensor sensitivity may be enhanced.

This fact means that the sensitivity of the sensor improves along with the downsizing of the sensor, which is an advantageous property from the viewpoint of downsizing the sensor.

The photodetection device 10 is configured to, for example, measure the illuminance inside a room, but this embodiment is one example, and the spectral characteristics of the photodiodes 1 and 2 are appropriately determined so as to be used as an ultraviolet sensor, for example.

First Modified Example

The photodiodes 1 and 2 store the electric charges more rapidly as the received light is more intense. For this reason, when the illuminance is large, there may be a case in which the outputs of the photodiodes 1 and 2 are saturated before the illuminance determination unit 12 detects the output of the differential circuit 15, with the result that a precise value may not be measured.

In view of the above-mentioned circumstances, in this modified example, as the intensity of received light is higher, the reset interval is more shortened, and a storage period of the electric charges is shortened, to thereby prevent the saturations of the photodiodes 1 and 2. As a result, the dynamic range may be widened.

Figure 4A:
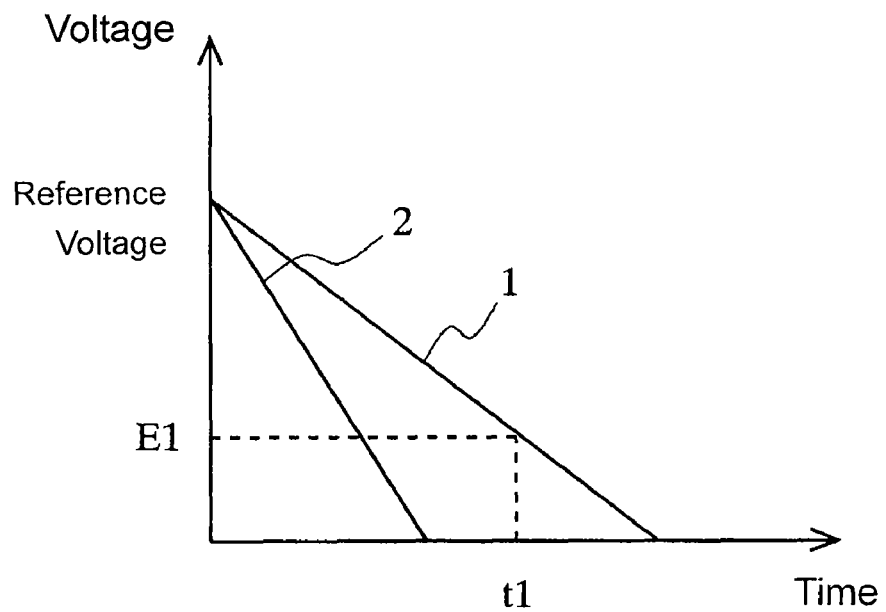
FIG. 4A is a schematic graphs illustrating saturation of outputs of the photodiodes.
Figure 4B:
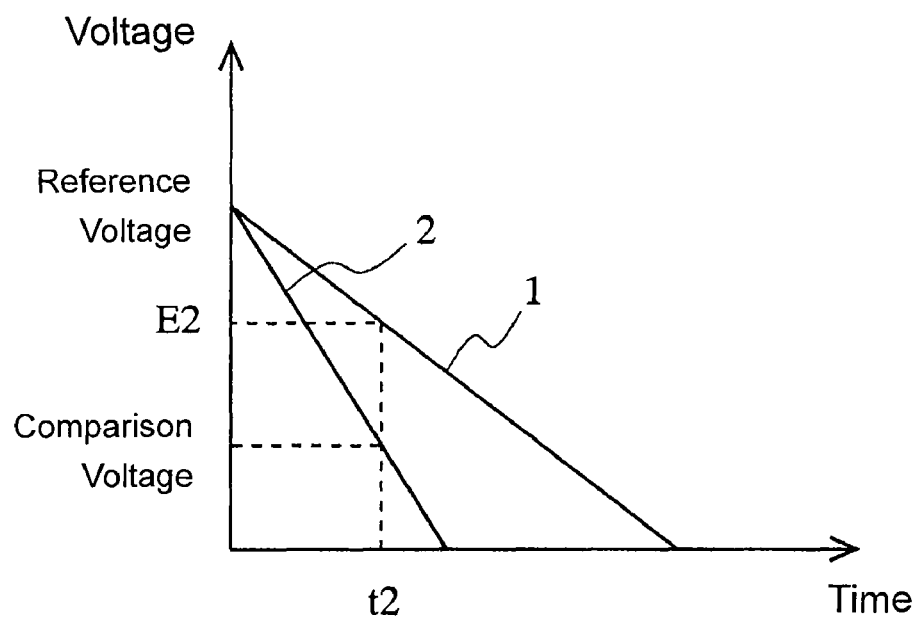
FIG. 4B is a schematic graph illustrating prevention of saturation by a reset.

FIG. 4(*a*) is a schematic graph for illustrating a case in which the output of the photodiode 2 is saturated at the time of reset.

First, when the switches 17 and 18 turn off after the photodiodes 1 and 2 are connected to the direct-current power supply 19 to set the voltage at the cathode terminals to the reference voltage, the voltage at the cathode terminals decrease as illustrated in FIG. 4(*a*).

In this example, it is assumed that the photodiode 2 has the voltage decreased at a rate higher than that of the photodiode 1 due to a difference in spectral characteristic.

In FIG. 4(*a*), because the light intensity is large, the output of the photodiode 2 is saturated before reaching a reset time t1.

When it is assumed that the illuminance determination unit 12 detects the output of the differential circuit 15 immediately before reset, E1 that is a voltage corresponding to the light intensity is detected in the photodiode 1 at the reset time t1, but a detection value corresponding to the light intensity may not be obtained in the photodiode 2 because the output thereof is saturated.

In this modified example, as illustrated in FIG. 4(*b*), reset is executed when the voltage across the photodiode having larger voltage drop (photodiode 2 in this case) reaches a predetermined reference voltage for comparison (hereinafter, referred to as "comparison voltage").

In an example of FIG. 4(*b*), reset is executed at a time t2 when the photodiode 2 becomes a comparison voltage, and in this case, the voltage across the photodiode 1 becomes E2.

For this reason, both of the photodiodes 1 and 2 may output the voltages corresponding to the light intensities.

Figure 5:
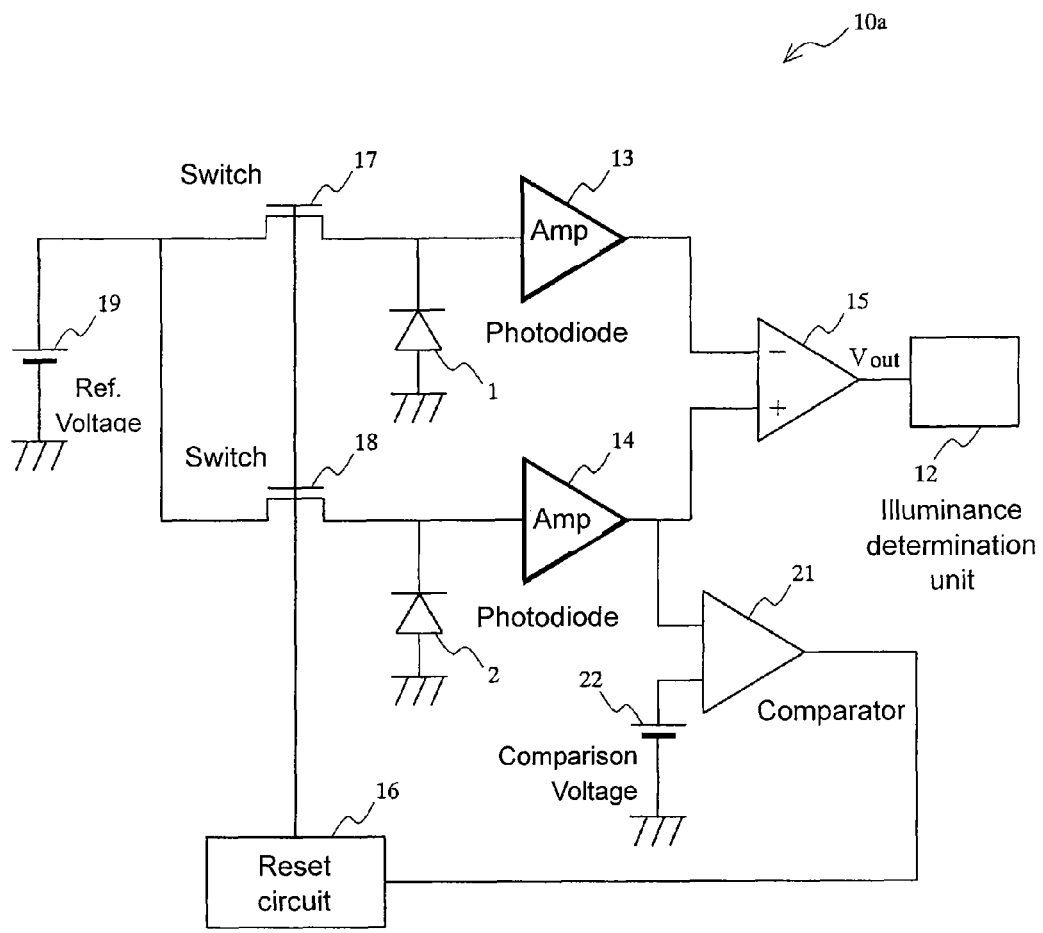
FIG. 5 is a diagram illustrating a configuration of a photodetection device according to a modified example.

FIG. 5 is a diagram illustrating the configuration of a photodetection device 10*a* for conducting the above-mentioned operation. The same configurations as those of FIG. 3 are denoted by identical reference numerals, and a description thereof is simplified or omitted.

The photodetection device 10*a* further includes a direct-current power supply 22 and a comparator 21, in addition to the configuration of the photodetection device 10.

The direct-current power supply 22 is a constant voltage source for providing the comparator 21 with a comparison voltage. In this example, the direct-current power supply 22 is configured so as to output a fixed comparison voltage. Alternatively, the direct-current power supply 22 may be configured so as to select a comparison voltage suitable for the light intensity, with the comparison voltage being variable.

The comparator 21 outputs "1", for example, when the output of the amplifier 14 is larger than the comparison voltage, and outputs "0" when the output of the amplifier 14 is equal to or smaller than the comparison voltage. Thus, the comparator 21 compares a magnitude relation between the voltage across the photodiode 2 which has been amplified and the amplifier 14 with the comparison voltage, and outputs its comparison result as a digital signal.

The reset circuit 16 monitors the output of the comparator 21, and resets the switches 17 and 18 upon detecting that the voltage across the amplifier 14 falls below to the comparison voltage (in the above-mentioned example, the reset circuit 16 detects that the output changes from "1" to "0").

As a result, the photodetection device 10a is capable of resetting the electric charges before the outputs of the photodiodes 1 and 2 are saturated.

Further, the illuminance determination unit 12 stores the voltage difference between the amplifiers 13 and 14, the reset interval, or the correspondence of the light intensities, so as to determine the illuminance based on the output of the differential circuit 15.

The comparator 21 and the direct-current power supply 22 function as changing means for changing, according to the light intensity, a period of time during which the storage means stores the electric charges.

As described above, in this modified example, there is provided a function of changing the period of time during which the light receiving element stores the electric charges, according to the illuminance (more specifically, the storage period of time is more shortened as the illuminance is larger), to thereby implement the illuminance sensor of a high dynamic range (wide range which is capable of measuring illuminance).

Second Modified Example

The amplifiers 13 and 14 and the differential circuit 15 of the photodetection device 10 (FIG. 3) receive the power supply from a power supply (not shown) so as to conduct an amplification process and a difference process.

Therefore, in this modified example, the amplifiers 13 and 14 and the differential circuit 15 are not always driven, but are intermittently driven only when the illuminance determination unit 12 detects the difference between the photodiodes 1 and 2 for determination (that is, only when necessary), to thereby save the power consumption.

Figure 6:
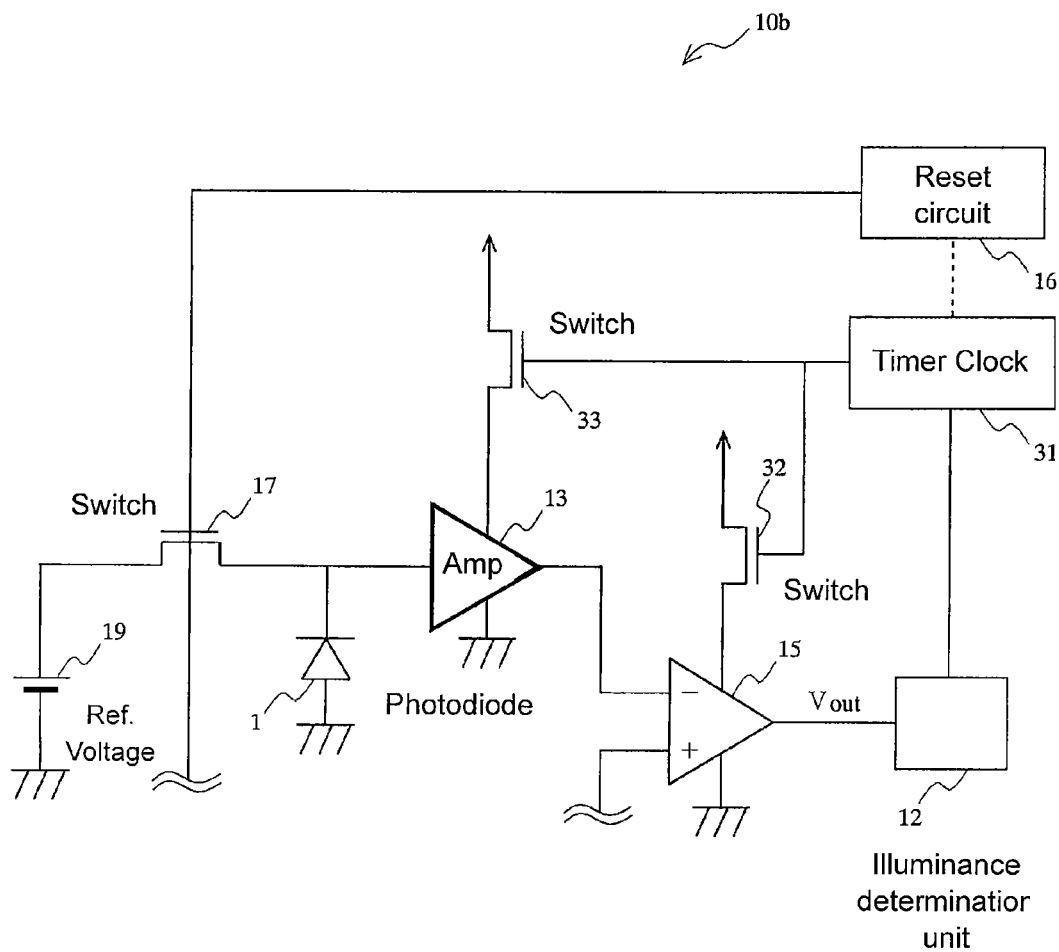
FIG. 6 is a diagram illustrating a configuration of a photodetection device according to another modified example.

FIG. 6 is a diagram illustrating a configuration of a photodetection device 10b according to this modified example.

It should be noted that the same configurations as those of FIG. 3 are denoted by identical reference numerals, and a description thereof is simplified or omitted.

Further, for simplification of the drawing, the photodiode 2, the amplifier 14, and the switch 18 are omitted.

A photodetection device 10b further includes a timer clock 31 and switches 32 and 33, in addition to the configuration of the photodetection device 10.

The switch 32 and the switch 33 are formed of switching elements such as transistors, and turn on/off power supply to the differential circuit 15 and the amplifier 13, respectively. Further, although not shown, the amplifier 14 is provided with a similar switch.

The timer clock 31 is a clock that turns on/off the switches 32 and 33 at predetermined time intervals, and also outputs the clock to the illuminance determination unit 12.

The timer clock 31 may be configured to, for example, generate a clock of a low cycle by dividing an internal clock by means of a frequency divider circuit.

The illuminance determination unit 12 operates in synchronism with the clock output by the timer clock 31, and detects the output of the differential circuit 15 at timing when the switches 32 and 33 turn on.

The reset circuit 16 operates in synchronism with the timer clock 31, and resets the electric charges of the photodiodes 1 and 2, for example, immediately after the illuminance determination unit 12 executes detection.

As described above, the timer clock 31, the switches 32 and 33, and a switch (not shown) disposed in the amplifier 14 function as driving means for driving the difference output means at timing when the difference output means outputs the difference.

As described above, the photodetection device 10b intermittently operates the amplifiers 13 and 14 and the differential circuit 15 only when the illuminance determination unit 12 detects and determines the difference between the outputs of the photodiodes 1 and 2. As a result, the power consumption may be reduced as compared with that of the photodetection device 10.

Third Modified Example

This modified example is to reduce an influence of flicker of a light source.

A light source such as a fluorescent lamp may repeat flicker in a cycle of 50 [Hz] or 60 [Hz]. Such a phenomenon is called "flicker".

In the photodetection device 10 (FIG. 3), when the light intensity of the light source which has flicker occurring therein is measured, the measured value of the illuminance varies depending on at which position of flicker at which has occurred at a moment when the illuminance determination unit 12 has detected the difference.

For example, a cellular phone is frequently used in a room interior, which is illuminated with a fluorescent lamp, and thus it is necessary that the light intensity should be appropriately measured even if flicker occurs.

Under the above-mentioned circumstance, in this modified example, the difference between the photodiodes 1 and 2 are time-averaged, to thereby reduce the influence of flicker.

Figure 7:
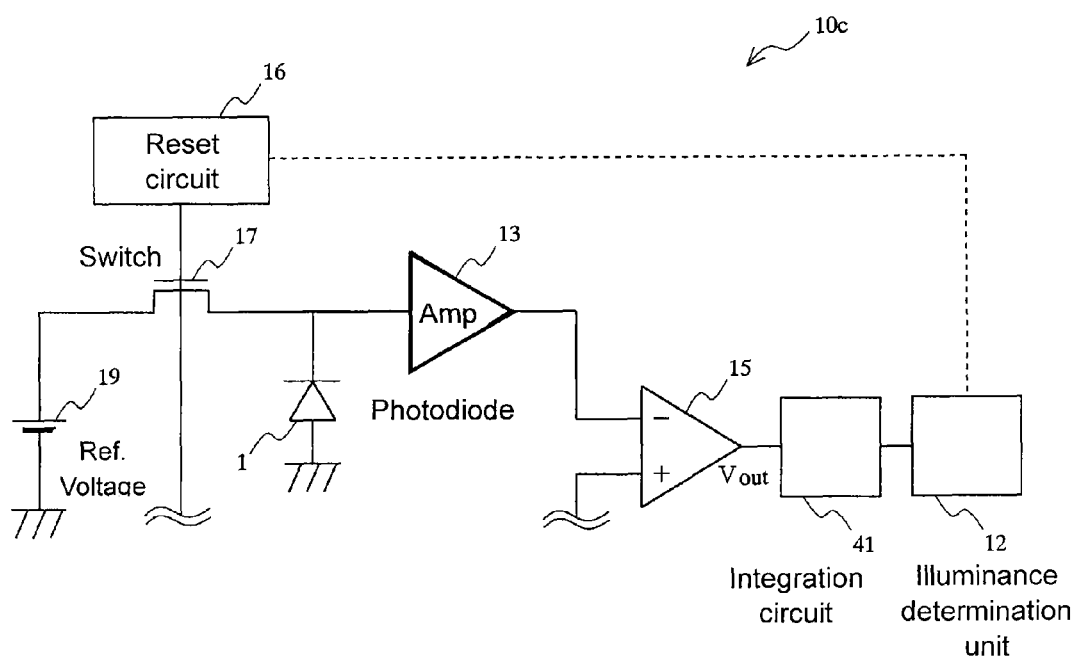
FIG. 7 is a diagram illustrating a configuration of a photodetection device according to yet another modified example.

FIG. 7 is a diagram illustrating a configuration of a photodetection device 10c that is designed with a countermeasure against flicker.

The same configurations as those of FIG. 3 are denoted by identical reference numerals, and a description thereof is simplified or omitted.

Further, for simplification of the drawing, the photodiode 2, the amplifier 14, and the switch 18 are omitted.

A photodetection device 10c is configured to include an integration circuit 41 between the differential circuit 15 and the illuminance determination unit 12 in the configuration of the photodetection device 10, and integrates the output of the differential circuit 15 with the integration circuit 41.

The integration circuit 41 integrates the output of the differential circuit 15 over time, and outputs the resultantly obtained integration value. The integration value is a cumulative value of a plurality of detection values, and thus a variation of the difference is reduced by averaging.

As described above, the integration circuit 41 functions as reduction means for reducing the variation occurring in the difference of the differential circuit 15 when the light intensity emitted from the light source varies due to flicker.

The illuminance determination unit 12 operates in association with the reset signal of the reset circuit 16, and detects the integration value at a time point when the reset circuit 16 resets a predetermined number of times after the integration circuit 41 has started integration.

When the illuminance determination unit 12 executes the detection, the illuminance determination unit 12 conducts initialization by, for example, setting the integration value of the integration circuit 41 to zero.

As described above, in this embodiment, even when the output of the differential circuit 15 is varied by flicker, the variation of the output is averaged by adding a plurality of measured values by the integration circuit 41, so as to obtain the detected value with limited influence of flicker.

In this modified example, integration is used to suppress the influence of flicker. Alternatively, there may be applied any method that may reduce the variation of the detection value due to flicker.

The embodiment and the modified examples described above may obtain the following effects.

(1) Electric charges generated by light that have been received by the photodiodes 1 and 2 may be stored.

(2) The difference between the electric charges generated in the two photodiodes 1 and 2 different in spectral characteristic is taken, to thereby allow the desired spectral characteristic to be obtained.

(3) The amount of electric charges generated in the photodiodes 1 and 2 may be detected by a voltage.

(4) The light intensity is measured by the electric charges that have been stored in the photodiodes 1 and 2, and hence no large light current is required, which allows the photodiodes 1 and 2 to be downsized.

(5) The photodiodes 1 and 2 may be reduced in capacity so as to obtain a large sensitivity, and hence the photodiodes 1 and 2 may be reduced in area, to thereby implement the sensor at low cost.

(6) The reset interval of electric charges that have been stored in the photodiodes 1 and 2 may be changed depending on the intensity of the outside light, to thereby realize the wide dynamic range.

(7) The amplifiers 13 and 14 and the differential circuit 15 are driven only when necessary, to thereby save power consumption.

(8) The integration circuit 41 alleviates the influence of flicker, to thereby reduce the influence of flicker.

(9) In the integrated circuit (IC) including the two light receiving elements different in the spectral characteristic, the amplifiers connected to the outputs of the light receiving elements, and the mechanism of resetting electric charges of the light receiving elements in a given cycle after the light receiving elements have been put into the floating state, the electric charges are stored in the light receiving elements in a given cycle, and the difference between the signals that have been amplified by the amplifiers is output, to thereby implement a small-sized illuminance sensor.

(Embodiment of Photodetection Semiconductor Device)

The photodetection device 10 may use the semiconductor device 6 with the structure illustrated in FIG. 1. Alternatively, however, a semiconductor device with a different structure may also be used.

In the following, a description is given of a semiconductor device according to another embodiment applicable to the photodetection device 10.

(First Embodiment of Photodetection Semiconductor Device)

The photodetection device 10 stores the electric charges in the photodiodes 1 and 2 so as to measure the illuminance. For this reason, there is a fear that the influence of electromagnetic wave from outside affects the measurement result, as compared with a case in which the difference of the current is taken as in the conventional art.

Under the above-mentioned circumstances, in this embodiment, a thin film electrode having an optical transparency is disposed on the photodiode, and the photodiodes are shielded from electromagnetic wave noises (for example, commercial electric waves or electromagnetic wave noises generated from electric devices) from outside.

FIG. 8(*a*) is a diagram illustrating a structure of a semiconductor device 6*a* according to this embodiment.

The semiconductor device 6*a* is a photodetection semiconductor device, in which the n-type layers 4 and 5 different in thickness are formed on the p-type substrate 3, as in the semiconductor device 6.

In this example, the photodiode 1 functions as a first light receiving element that is formed of a semiconductor substrate (p-type substrate 3) formed of a first conductivity type (p-type in this example) semiconductor and a first conductive layer (n-type layer 4) formed of a second conductive type (n-type in this example) semiconductor which is formed with a predetermined depth from a surface of the semiconductor substrate, and the photodiode 2 functions as a second light receiving element formed of a semiconductor substrate (p-type substrate 3) and a second conductive layer (n-type layer 5) formed of a second conductivity type semiconductor which is formed with a depth deeper than a predetermined depth from the surface of the semiconductor substrate.

Thin film p-type layers 51, 51, . . . are formed on upper surfaces of the n-type layers 4 and 5.

The p-type layers 51 each have transparency with respect to light to be detected, and is electrically conductive. Accordingly, each of the p-type layers 51 transmits light for illuminance measurement, while shielding the electromagnetic waves that enter the light receiving surface from outside.

The p-type layer 51 may be formed through a normal semiconductor manufacturing process when manufacturing the semiconductor device 6*a*, and hence the p-type layers 51 may be formed at low cost.

As described above, electromagnetic wave shield layers (p-type layers 51) that transmit light and have the conductivity are formed on the surfaces of the first conductive layer (n-type layer 4) and the second conductive layer (n-type layer 5).

The p-type layers 51 may more effectively exhibit the shield function by grounding.

Aluminum wirings 52, 52 that are connected to the n-type layers 4 and 5 are connected to the n-type layers 4 and 5 through n+ layers 55 with high concentration of n-type, respectively.

Wiring through-holes are provided in the p-type layers 51, and the aluminum wirings 52 are formed in the through-holes.

Further, the p-type substrate 3 is connected to an aluminum wiring 54 through a p+ layer 56 with high concentration of p-type, and is grounded.

Light shielding aluminums 53, 53, . . . are formed on the light receiving surface in regions in which no photodiode is formed, and shield the incidence of light.

FIG. 8(*b*) is a schematic graph illustrating an outline of the spectral characteristics of the photodiode 1 (PD1) and the photodiode 2 (PD2).

The photodiode 1 with the deeper n-type layer 4 is higher in sensitivity on the infrared light side than the photodiode 2.

Figure 9A:
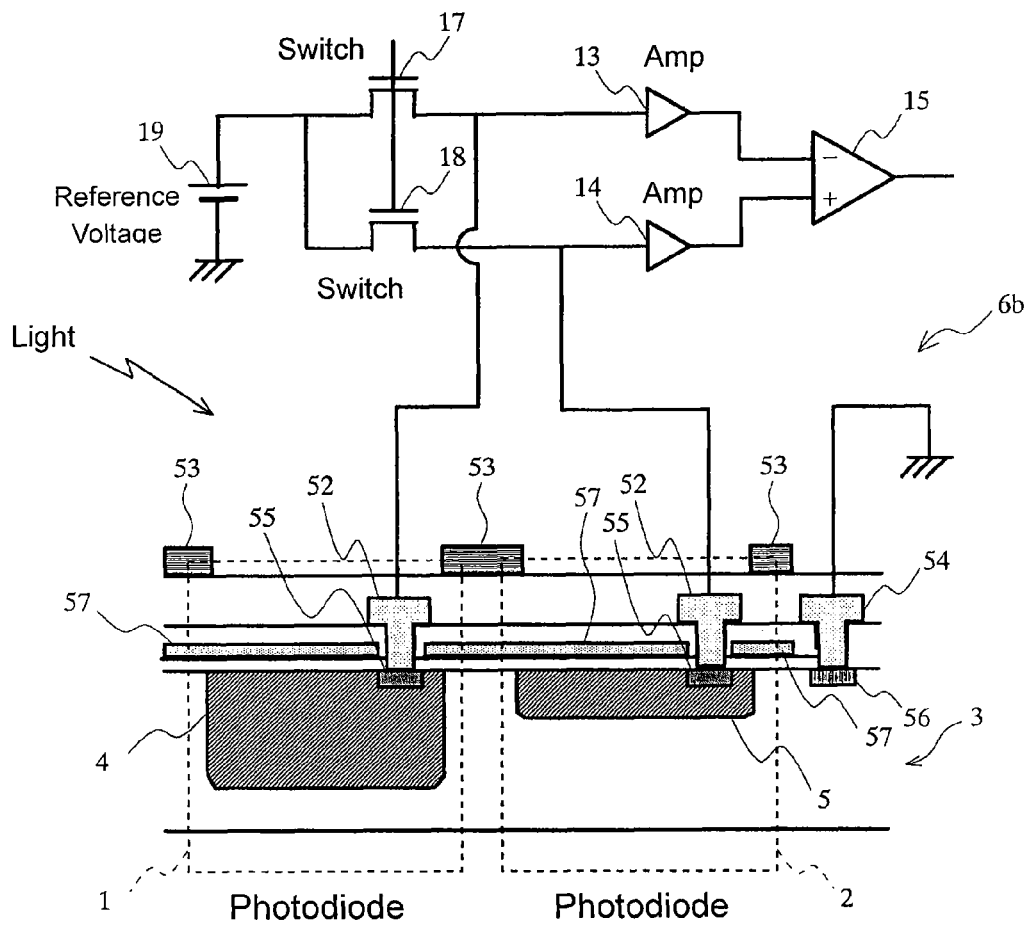
FIG. 9A is a diagram illustrating a structure of a semiconductor device according to a modified example.
Figure 9B:
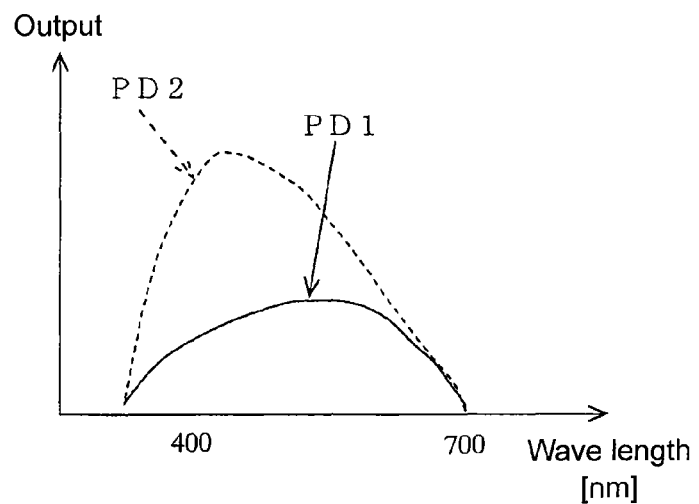
FIG. 9B is a schematic graph illustrating spectral characteristics of the photodiodes.

FIG. 9(*a*) is a diagram illustrating a structure of a semiconductor device 6*b* according to a modified example of this embodiment.

The semiconductor device 6*b* includes thin-film polysilicon layers 57, 57, . . . . Each of the polysilicon layers 57 may also transmit the light to be detected, while shielding electromagnetic waves. Further, the polysilicon layers 57 may be readily formed through the normal semiconductor manufacturing process.

Other configurations are identical with those of the semiconductor device 6*a*, and the spectral characteristic is also identical with that of the semiconductor device 6*a* as illustrated in FIG. 9(*b*).

As described above, in this embodiment as well as in the modified example, the thin film electrode having transparency (for example, polysilicon of about 1,000 [Å]) is disposed on the light receiving element, to thereby shield the electromagnetic wave noises from outside.

(Second Embodiment of Photodetection Semiconductor Device)

In this embodiment, the depth of the n-type layers is identical, and a filter having the spectral characteristic is disposed on the light receiving surface, to thereby provide a difference in the spectral characteristic between the photodiodes 1 and 2.

FIG. 10(a) is a diagram illustrating a structure of a semiconductor device 6c according to this embodiment.

An n-type layer 7 of the photodiode 2 is formed with the same depth as that of the n-type layer 4. For this reason, the spectral characteristics caused by the depth of the n-type layer of the photodiode 1 and the photodiode 2 are identical with each other.

On the other hand, a polysilicon layer 61 is formed on an upper surface of the n-type layer 4, and a polysilicon layer 62 that is thicker than the polysilicon layer 61 is formed on an upper surface of the n-type layer 7. Other configurations are identical with those of the semiconductor device 6.

As described above, in the semiconductor device 6c, a filter layer (polysilicon layer 61) whose light transmittance depends on the wavelength of light is formed on the surface of the first conductive layer (n-type layer 4), and a filter layer (polysilicon layer 62) having a dependency different from that of the filter layer is formed on the surface of the second conductive layer (n-type layer 7).

Polysilicon has the characteristic that attenuates (cuts) light in a range of from blue to ultraviolet as the thickness thereof becomes larger, as illustrated in FIG. 10(b). In other words, the filters formed of polysilicon are different in transmittance depending on the wavelength of light.

For this reason, the polysilicon layer 62 is low in transmittance of light in the range of from blue to ultraviolet as compared with the polysilicon layer 61. With this configuration, the photodiode 1 and the photodiode 2 exhibit the different spectral characteristics.

As described above, polysilicon layers different in film thickness are disposed on the light receiving element, to thereby provide the different spectral characteristics.

FIG. 10(c) is a schematic graph illustrating the spectral characteristics of the photodiodes 1 and 2, in which the photodiode 2 is lower in sensitivity on the shorter wavelength side of light as compared with the photodiode 1.

In this embodiment, the thin film of polysilicon is used as the filter. However, for example, the thin film of the p-type layer may also be used as the filter.

Figure 11A:
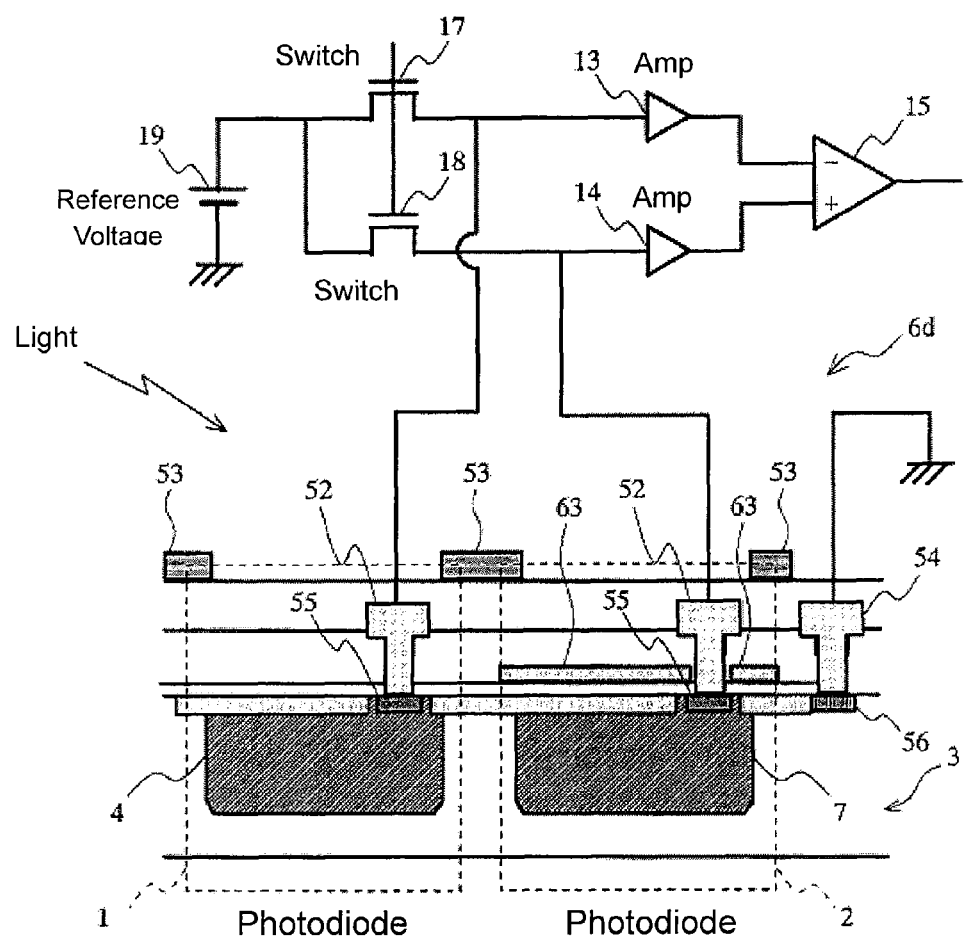
FIG. 11A is a diagram illustrating a structure of a semiconductor device according to another modified example.

FIG. 11(a) is a diagram illustrating a structure of a semiconductor device 6d according to a modified example of this embodiment. In this example, no polysilicon layer is formed on the light receiving surface of the photodiode 1, and a polysilicon layer 63 is formed on the light receiving surface of the photodiode 2.

Figure 11B:
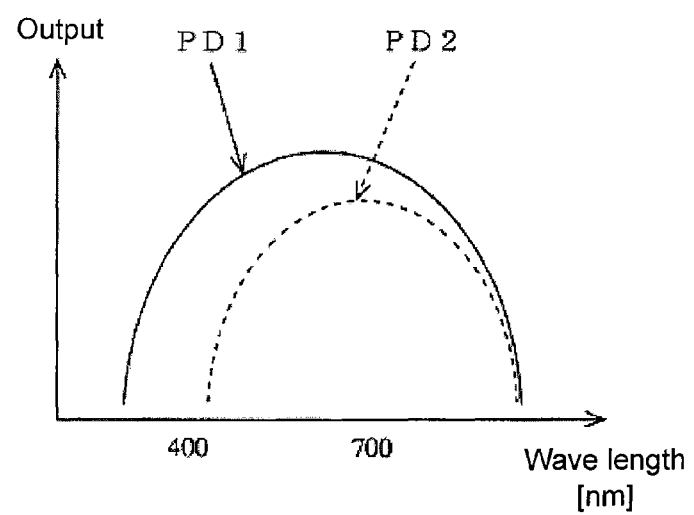
FIG. 11B is a schematic graph illustrating spectral characteristics of the photodiodes.

Even in this case, light attenuates in the range of from blue to ultraviolet among the light received by the photodiode 2, and hence the same characteristic as that of the semiconductor device 6c is obtained as illustrated in FIG. 11(b).

In the above-mentioned description, in the semiconductor devices 6c and 6d, the depths of the n-type layers 4 and 7 are identical with each other, which may be different from each other.

Both of the thicknesses of the filter and the n-type layer may be adjusted, to thereby allow more diverse spectral characteristics to be realized.

Further, the polysilicon layer has conductivity and also has a function of shielding the electromagnetic wave, and hence both of the spectral characteristic of the photodiodes and the shield of the electromagnetic wave may be realized.

According to the embodiment and the modified example described above, there may be obtained the following effects.

(1) Electromagnetic waves that enter the light receiving surface may be attenuated or cut by the thin film having conductivity.

(2) The filters different in transmittance depending on the wavelength of light are provided on the light receiving surface, to thereby impart the spectral characteristics to the photodiodes.

(3) The filter has conductivity, and thus the filter may shield the electromagnetic wave at the same time.

(Embodiment of Digital Output Photodetection Circuit)

The outputs of the photodiodes 1 and 2 are analog values, and what utilizes the light intensity detected by the photodiodes 1 and 2 is a digital device such as a cellular phone.

For this reason, it is necessary to convert the detection values obtained by the photodiodes 1 and 2 into digital signals.

In the case of converting the outputs of the photodiodes into the digital signals, the conversion into the digital signals has been executed by means of an A/D converter in the conventional art.

As to the above-mentioned technology, there is proposed a "photosensor circuit" disclosed in, for example, JP 11-304584 A.

In this technology, a plurality of reference voltages for detecting the outputs of the photodiodes are provided, and any one of the reference voltages is selected according to an input range of the A/D converter.

However, the use of the A/D converter makes the scale of logic larger, resulting in a correspondingly larger circuit scale. For this reason, there arises such a problem that the size of the IC chip increases, which does not keep with a demand for downsizing, and the manufacture costs increase.

Under the above-mentioned circumstance, in this embodiment, there is provided a digital output photodetection circuit that requires no A/D converter which is large in circuit scale, by taking the advantages of the characteristic that the photodiodes 1 and 2 store electric charges.

(First Embodiment of Digital Output Photodetection Circuit)

In this embodiment, a period of time during which voltages of the photodiodes 1 and 2 drop is measured by the number of reference pulses, to thereby digitize the light intensity.

Figure 12A:
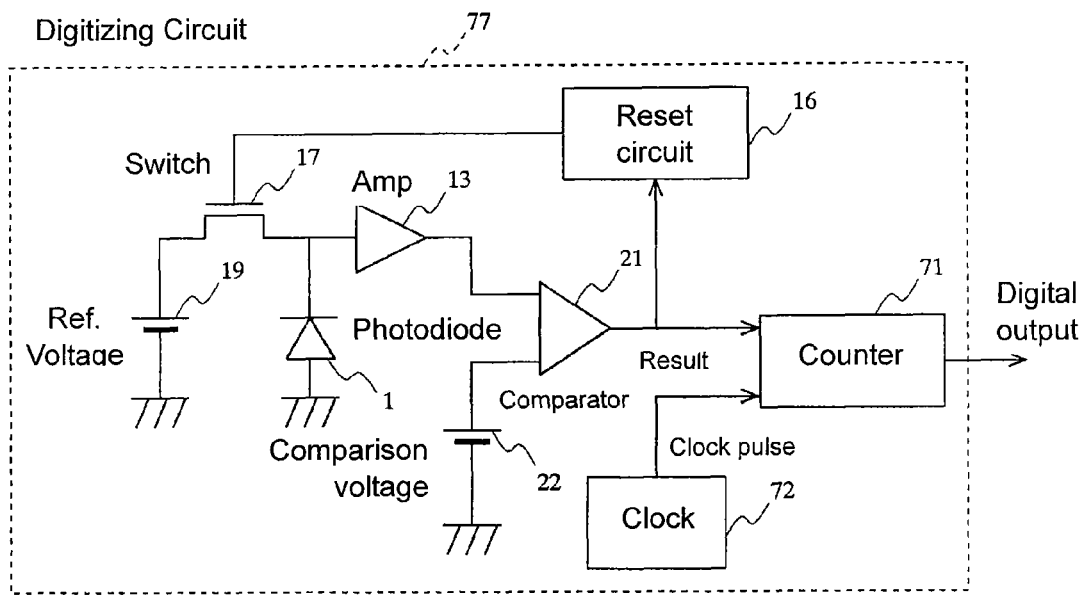
FIG. 12A is a diagram illustrating a configuration of a digitizing circuit.

FIG. 12(a) is a diagram illustrating a configuration of a digitizing circuit 77 that digitizes the output of the photodiode 1.

The digitizing circuit 77 is configured by using the same elements as those of the photodetection device 10a illustrated in FIG. 5. The same elements as those of FIG. 5 are denoted by identical reference numerals, and a description thereof is omitted or simplified.

The comparator 21 outputs "1", for example, when the output of the amplifier 13 is larger than the comparison voltage, and outputs "0" when the output of the amplifier 13 is equal to or smaller than the comparison voltage. Thus, the comparator 21 compares a magnitude relation between the voltage across the photodiode 1 which has been amplified and the amplifier 13 with the comparison voltage, and outputs its comparison result as a digital signal.

The reset circuit 16 monitors the output of the comparator 21, and turns on the switch 17 to resets the electric charge of the photodiode 1 when the reset circuit 16 detects that the voltage across the amplifier 13 falls below to the comparison voltage (in the above-mentioned example, when the reset circuit 16 detects that the output changes from "1" to "0").

A period of time during which the voltage across the photodiode 1 (amplified by the amplifier 13, the same is applied below) reaches the comparison voltage from the reference voltage becomes shorter as the light intensity becomes larger. As a result, an interval during which the reset circuit 16 executes reset is shortened.

A clock 72 generates a clock pulse that is a pulse signal having regular intervals, and inputs the clock pulse to a counter circuit 71.

A pulse width of the clock pulse is set to be sufficiently shorter compared with a period of time during which the voltage across the photodiode 1 reaches the comparison voltage from the reference voltage so that the period of time may be measured.

The clock 72 functions as clock signal generation means that generates the clock signal.

The counter circuit 71 receives an input of the digital signal indicative of the comparison result from the comparator 21, and also an input of the clock pulse from the clock 72.

Then, with the use of those signals, the counter circuit 71 counts the number of pulses of clock pulses in a period of time during which the voltage across the photodiode 1 decreases from the reference voltage to the comparison voltage, and outputs the count value.

A period of time until the output of the photodiode 1 reaches the comparison voltage is in inverse proportion to the light intensity, and hence the count value becomes smaller as the light intensity becomes larger. Therefore, the count value corresponding to the light intensity may be obtained.

As described above, the counter circuit 71 functions as count value generation means that associates the amount of an electric charge stored in the photodiode 1 with the clock signal generated by the clock 72 to generate a count value corresponding to the amount of the stored electric charge, and also functions as count value output means that outputs the generated count value.

Further, the counter circuit 71 generates the number of clock signals that have been generated until the stored electric charge changes from an initial value to a predetermined value as the count value.

FIGS. 13(a)-13(d) are timing charts of the digitizing circuit 77.

The output of the photodiode 1 (FIG. 13(a)) is reset to the reference voltage according to the reset signal (FIG. 13(c)) of the reset circuit 16, and thereafter is decreased at higher rate as the light intensity becomes larger until the output reaches the comparison voltage.

The comparison result (FIG. 13(b)) output by the comparator 21 outputs "0" when the voltage across the photodiode 1 reaches the comparison voltage from the reference voltage, with the result that the reset circuit 16 outputs the reset signal (FIG. 13(c)).

The counter circuit 71 measures the clock pulse that is generated by the clock 72 during a period when the comparison result of the comparator 21 is "1" (clock pulse measurement period of FIG. 13(d)), and outputs the measurement value.

In the above-mentioned manner, in the digitizing circuit 77, the measured clock pulse becomes smaller as the light intensity becomes larger, and hence the number of pulses corresponding to the light intensity is obtained.

Figure 12B:
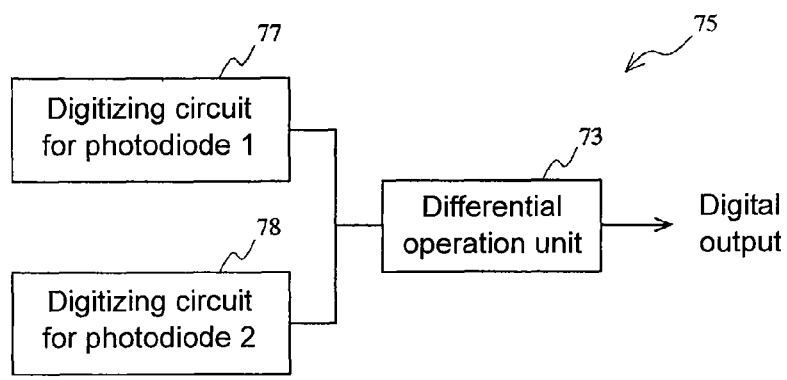
FIG. 12B is a diagram illustrating a configuration of a digital output photodetection circuit.

FIG. 12(b) is a diagram for illustrating a configuration of a digital output photodetection circuit 75 according to this embodiment.

The digital output photodetection circuit 75 includes the digitizing circuit 77 that digitizes the output of the photodiode 1, and a digitizing circuit 78 that digitizes the output of the photodiode 2. A configuration of the digitizing circuit 78 is identical with that of the digitizing circuit 77.

A differential operation unit 73 receives the outputs of the photodiodes 1 and 2 which have been converted into the digital values from the digitizing circuits 77 and 78, calculates a difference therebetween through digital processing, and outputs the calculated difference as a digital value.

As described above, the differential operation unit 73 functions as count value acquisition means for acquiring a first count value corresponding to the amount of an electric charge stored in the first light receiving element (photodiode 1), and a second count value corresponding to the amount of an electric charge stored in the second light receiving element (photodiode 2) having the spectral characteristic different from that of the first light receiving element. The differential operation unit 73 also functions as differential operation means for calculating a difference between the acquired first count value and second count value in a digital manner, and also functions as difference output means for outputting the calculated difference as the digital value.

In the above-mentioned manner, in the digital output photodetection circuit 75, the difference between the outputs of the photodiodes 1 and 2 may be digitized with a simple configuration using the counter circuit 71 and the clock 72 even without using operation logic such as an A/D converter.

(Second Embodiment of Digital Output Photodetection Circuit)

In this embodiment, the number of resetting the photodiodes 1 and 2 is measured within a period of a reference pulse to thereby digitize the light intensity.

The amount of electric charges that have been stored within a period of the reference pulse is measured by each storage amount unit, to thereby associate the amount of stored electric charges with the generated clock signals.

FIG. 14(a) is a diagram illustrating a configuration of a digitizing circuit 77a that digitizes the output of the photodiode 1.

The configuration of the digitizing circuit 77a according to this embodiment is identical with that of the digitizing circuit 77 described in the first embodiment, and thus the corresponding elements are denoted by identical reference numerals, and a description thereof is omitted or simplified.

The configurations of the comparator 21 and the reset circuit 16 are identical with those of FIG. 12(a).

A clock 72a generates a reference pulse that is a pulse signal having regular intervals, and inputs the reference pulse to the counter circuit 71.

A pulse width of the reference pulse is set to be sufficiently longer as compared with a period of time during which the reset circuit 16 resets the photodiode 1 so that the number of resetting when the voltage across the photodiode 1 reaches the comparison voltage from the reference voltage may be measured.

When the reference pulse width is set to be longer than the cycle of flicker (about 200 [ms] in fluorescent lamp), it is possible to reduce the measurement error caused by flicker.

The counter circuit 71a receives an input of the digital signal indicative of the comparison result from the comparator 21, and also an input of the reference pulse from the clock 72a.

Then, with the use of those signal and pulse, the counter circuit 71a counts the number of resetting by the reset circuit 16 when the voltage across the photodiode 1 decreases from the reference voltage to the comparison voltage during the reference pulse, that is, the number of times when the output of the photodiode 1 reaches the comparison voltage within the reference pulse, and outputs the counted number of times.

The number of times when the output of the photodiode 1 reaches the comparison voltage within a given period of time is in proportion to the light intensity, and hence the number of times is indicative of the light intensity.

In the digitizing circuit 77 according to the first embodiment, the number of outputting becomes smaller as the light intensity becomes larger. On the other hand, in the digitizing circuit 77*a* according to this embodiment, the number of outputting becomes larger as the light intensity becomes larger. As a result, the digitizing circuit 77*a* is more suited for the feeling of a user who uses the sensor.

As described above, the digitizing circuit 77*a* includes reset means (reset circuit 16, switch 17, etc.) that resets the stored electric charge to an initial value every time the amount of the electric charge stored in the photodiode 1 reaches a predetermined amount, and the counter circuit 71*a* functions as count value generation means that generates the number of times the reset means resets during a predetermined time measured by the clock signal as a count value.

Figure 15:
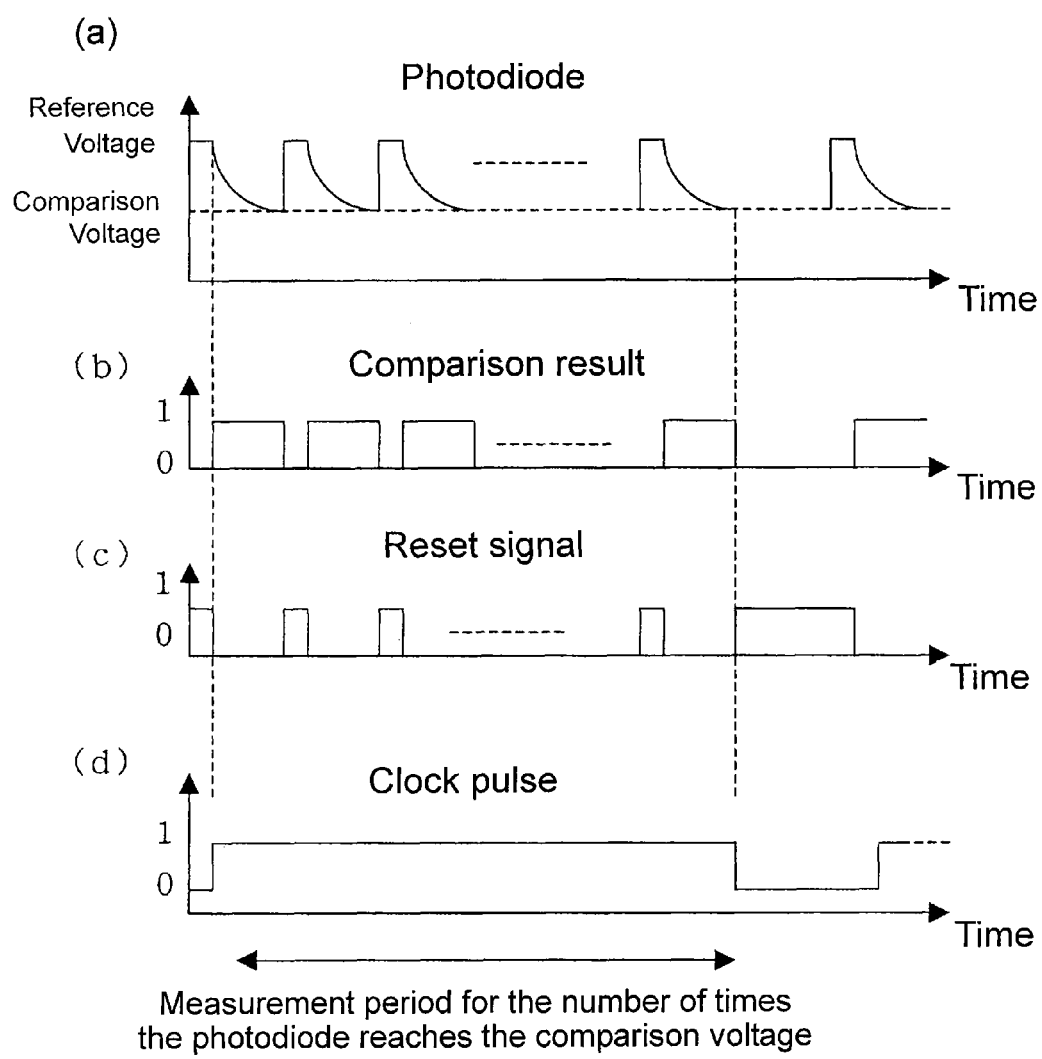
FIGS. 15(a)-15(d) are timing charts of the digitizing circuit according to another embodiment.

FIGS. 15(*a*)-15(*d*) are timing charts of the digitizing circuit 77*a* according to the second embodiment.

The output of the photodiode 1 (FIG. 15(*a*)) is reset to the reference voltage according to the reset signal (FIG. 15(*c*)) of the reset circuit 16, and thereafter is decreased at higher rate as the light intensity becomes larger until the output of the photodiode 1 reaches the comparison voltage.

The comparison result (FIG. 15(*b*)) output by the comparator 21 outputs "0" when the voltage across the photodiode 1 reaches the comparison voltage from the reference voltage, with the result that the reset circuit 16 outputs the reset signal (FIG. 15(*c*)).

The counter circuit 71*a* measures and outputs the number of times the voltage of the photodiode 1 reaches the comparison voltage, that is, the number of times the reset circuit 16 resets the photodiode 1, during a period when the reference pulse generated by the clock 72*a* is "1" (measurement period of number of times voltage of photodiode of FIG. 15(*d*) reaches comparison voltage).

In the above-mentioned manner, in the digitizing circuit 77*a*, the number of times of resetting of the photodiode 1 is increased as the light intensity becomes larger, to thereby obtain the number of pulses according to the light intensity.

FIG. 14(*b*) is a diagram for illustrating the configuration of a digital output photodetection circuit 75*a* according to this embodiment.

The digital output photodetection circuit 75*a* includes the digitizing circuit 77*a* that digitizes the output of the photodiode 1, and a digitizing circuit 78*a* that digitizes the output of the photodiode 2. The configuration of the digitizing circuit 78*a* is identical with that of the digitizing circuit 77*a*.

The differential operation unit 73 receives the outputs of the photodiodes 1 and 2 which have been converted into the digital values from the digitizing circuits 77*a* and 78*a*, calculates a difference therebetween through digital processing, and outputs the calculated difference as a digital value.

In the above-mentioned manner, in the digital output photodetection circuit 75*a*, the difference between the outputs of the photodiodes 1 and 2 may be digitized with a simple configuration using the counter circuit 71*a* and the clock 72*a* even without using operation logic such as an A/D converter.

Further, the digitizing circuit 77*a* according to this embodiment constitutes the digital output photodetection circuit including a light receiving element that generates an electric charge according to the received light, reset means for resetting the electric charge stored in the light receiving element to an initial value when the light receiving element stores a predetermined amount of the electric charge; and number-of-times output means for outputting the number of times of resetting of the light receiving element by the reset means during a predetermined period of time.

The embodiment described above may obtain the following advantages.

(1) The amount of electric charges stored in the photodiodes 1 and 2 may be associated with the clock. As a result, the count value corresponding to the amount of the electric charges may be generated to digitize the amount of the electric charges stored in the photodiodes 1 and 2.

(2) Digitalization may be executed by using simple elements such as the counter circuit 71 or the clock 72, and hence it is unnecessary to use the large-scaled logic such as an A/D converter.

(3) It is unnecessary to use the A/D converter, and hence the IC chip may be downsized.

(4) A period of time until the voltage of the light receiving element reaches the reference voltage may be measured by the clock pulse, and the number of pulses may be output as the digital value.

(5) The number of times the voltage of the light receiving element reaches the reference voltage within a given period of time produced by the reference pulse may be measured and output as the digital value.

In the above, various embodiments and modified examples have been described, and the various embodiments and modified examples may provide the following configurations.

(A) The embodiment of the photodetection device may obtain the following configurations.

(First Configuration) A photodetection device including: a first light receiving element for generating an electric charge based on received light; a second light receiving element for generating an electric charge based on received light and has a spectral characteristic different from a spectral characteristic of the first light receiving element; storage means for storing the generated electric charges in the first light receiving element and the second light receiving element; difference acquisition means for acquiring a difference between the electric charges stored in the first light receiving element and the second light receiving element; and difference output means for outputting the acquired difference.

(Second Configuration) The photodetection device according to the first configuration, in which the storage means causes predetermined electrodes of the first light receiving element and the second light receiving element to be electrically opened, to store the electric charges.

(Third Configuration) The photodetection device according to the second configuration, in which: the predetermined electrodes of the first light receiving element and the second light receiving element are connected, through predetermined switches, to a constant voltage source for resetting the electric charges stored in the light receiving elements; and the storage means turns off the predetermined switches to electrically open the predetermined electrodes.

(Fourth Configuration) The photodetection device according to the second or third configuration, in which the difference acquisition means acquires the difference between the stored electric charges based on a voltage difference between the predetermined electrodes of the first light receiving element and the second light receiving element.

(Fifth Configuration) The photodetection device according to the first configuration, in which the photodetection device includes reset means for resetting the electric charges stored in the first light receiving element and the second light receiving element by connecting the predetermined electrodes of the first light receiving element and the second light receiving element to a predetermined constant voltage source.

(Sixth Configuration) The photodetection device according to any one of the first to fifth configurations, in which the photodetection device includes changing means for changing electric charge storage time of the storage means based on intensity of light.

(Seventh Configuration) The photodetection device according to any one of the first to sixth configurations, in which the photodetection device includes driving means for driving the difference acquisition means at a timing at which the difference is output from the difference output means.

(Eighth Configuration) The photodetection device according to any one of the first to seventh configurations, in which the photodetection device includes reduction means for reducing a variation occurring in the difference output from the difference output means, which is caused by a variation in intensity of light emitted from a light source.

(Ninth Configuration) An image display device including: the photodetection device according to any one of the first to eighth configurations; image display means for displaying an image; brightness determination means for determining brightness of an outside world based on an output from the photodetection device; and luminance adjustment means for adjusting luminance of the image display means based on the determined brightness.

(B) The first embodiment of the photodetection semiconductor device provides the following configurations.

(First Configuration) A photodetection semiconductor device including: a first light receiving element; a second light receiving element having a spectral characteristic different from a spectral characteristic of the first light receiving element; and an electromagnetic wave shield layer that transmits light and has conductivity, in which a light intensity is detected by using a difference between an electric charge stored in the first light receiving element and an electric charge stored in the second light receiving element, in which the first light receiving element includes: a semiconductor substrate formed of a first conductivity type semiconductor; and a first conductive layer having a second conductivity type semiconductor formed with a predetermined depth from a surface of the semiconductor substrate, in which the second light receiving element includes: the semiconductor substrate; and a second conductive layer having the second conductivity type semiconductor formed with a depth larger than the predetermined depth from the surface of the semiconductor substrate, and in which the electromagnetic wave shield layer is formed on a surface of the first conductive layer and a surface of the second conductive layer.

(Second Configuration) The photodetection semiconductor device according to the first configuration, in which the electromagnetic wave shield layer is formed of the first conductivity type semiconductor.

(Third Configuration) The photodetection semiconductor device according to the first configuration, in which the electromagnetic wave shield layer is formed of polysilicon.

(Fourth Configuration) A photodetection device, including: storage means, which is connected to the photodetection semiconductor device according to the first, second, or third configuration, the storage means being for storing, in the first light receiving element and the second light receiving element of the photodetection semiconductor device, the electric charges generated in the first light receiving element and the second light receiving element; difference acquisition means for acquiring a difference between the stored electric charges; and difference output means for outputting the acquired difference.

(Fifth Configuration) An image display device including: the photodetection device according to the fourth configuration; image display means for displaying an image; brightness determination means for determining brightness of an outside world based on an output from the photodetection device; and luminance adjustment means for adjusting luminance of the image display means based on the determined brightness.

(C) The second embodiment of the photodetection semiconductor device provides the following configurations.

(First Configuration) A photodetection semiconductor device including: a first light receiving element; a second light receiving element; a first filter layer having light transmittance depending on a wavelength of light; and a second filter layer having dependency in light transmittance different from dependency of the first filter layer, in which light intensity is detected by using a difference between an electric charge stored in the first light receiving element and an electric charge stored in the second light receiving element, in which the first light receiving element includes: a semiconductor substrate formed of a first conductivity type semiconductor; and a first conductive layer having a second conductivity type semiconductor formed with a given depth from a surface of the semiconductor substrate, in which the second light receiving element includes: the semiconductor substrate; and a second conductive layer having the second conductivity type semiconductor formed with the predetermined depth from the surface of the semiconductor substrate, in which the first filter layer is formed on a surface of the first conductive layer, and in which the second filter layer is formed on a surface of the second conductive layer or prevented from being formed on the surface of the second conductive layer.

(Second Configuration) The photodetection semiconductor device according to the first configuration, in which the first filter layer and the second filter layer have conductivity.

(Third Configuration) The photodetection semiconductor device according to the first or second configuration, in which the first filter layer and the second filter layer are formed of the first conductivity type semiconductor.

(Fourth Configuration) The photodetection semiconductor device according to the first or second configuration, in which the first filter layer and the second filter layer are formed of polysilicon.

(Fifth Configuration) A photodetection device including: storage means, which is connected to the photodetection semiconductor device according to any one of the first to fourth configurations, the storage means being for storing, in the first light receiving element and the second light receiving element of the photodetection semiconductor device, the generated electric charges; difference acquisition means for acquiring a difference between the stored electric charges; and difference output means for outputting the acquired difference.

(Sixth Configuration) An image display device including: the photodetection device according to the fifth configuration; image display means for displaying an image; brightness determination means for determining brightness of an outside world based on an output from the photodetection device; and luminance adjustment means for adjusting luminance of the image display means based on the determined brightness.

(D) The embodiment of the digital output photodetection circuit provides the following configurations.

(First Configuration) A digital output photodetection circuit including: light receiving elements generating electric charges based on received light; storage means for storing the electric charges generated in the light receiving elements; clock signal generation means for generating a clock signal;

count value generation means for generating a count value corresponding to an amount of the stored electric charges by associating the amount of the stored electric charges with the generated clock signal; and count value output means for outputting the generated count value.

(Second Configuration) The digital output photodetection circuit according to the first configuration, in which the count value generation means generates the number of clock signals which are generated until the stored electric charges change to a predetermined value from an initial value as the count value.

(Third Configuration) The digital output photodetection circuit according to the first configuration, further including reset means for resetting the stored electric charges to an initial value every time the amount of the stored electric charges reaches a predetermined amount, in which the count value generation means generates the number of times of resetting by the reset means during a predetermined period of time measured by the clock signal as the count value.

(Fourth Configuration) A photodetection device using the digital output photodetection circuit according to any one of the first, second, or third configuration, the photodetection device including: count value acquisition means for acquiring a first count value corresponding to an amount of an electric charge stored in a first light receiving element, and a second count value corresponding to an amount of an electric charge stored in a second light receiving element having a spectral characteristic different from a spectral characteristic of the first light receiving element; differential operation means for calculating a difference between the acquired first count value and the acquired second count value in a digital manner; and a difference output means for outputting the calculated difference as a digital value.

(Fifth Configuration) An image display device including: the photodetection device according to the fourth configuration; image display means for displaying an image; brightness determination means for determining brightness of an outside world based on an output from the digital output photodetection circuit; and luminance adjustment means for adjusting luminance of the image display means based on the determined brightness.

[Second Embodiment of Photodetection Device]

The photodetection device 10 (FIG. 3) according to this embodiment detects electric charges stored during a given period of time in the same photodiodes 1 and 2 of which the cathode terminals are in an open end state.

In this case, an optical filter for blocking infrared light and ultraviolet light is provided above the photodiode 1, and hence visible light reaches the photodiode 1.

In contrast to this, a light shield layer for blocking infrared light, ultraviolet light, and visible light is provided above the photodiode 2 to prevent light from reaching the photodiode 2. When light is not incident, an electric charge generated in the photodiode 2 is detected.

The electric charge induced in the photodiode 2 when light is not incident is a dark electric charge detected as a dark current if the electric charge is detected as a current.

In this embodiment, a desired light intensity is detected by removing a dark electric charge noise component from a difference between the electric charges stored during the given period of time in the photodiodes 1 and 2 of which the cathode terminals are in the open end state.

Figure 16:
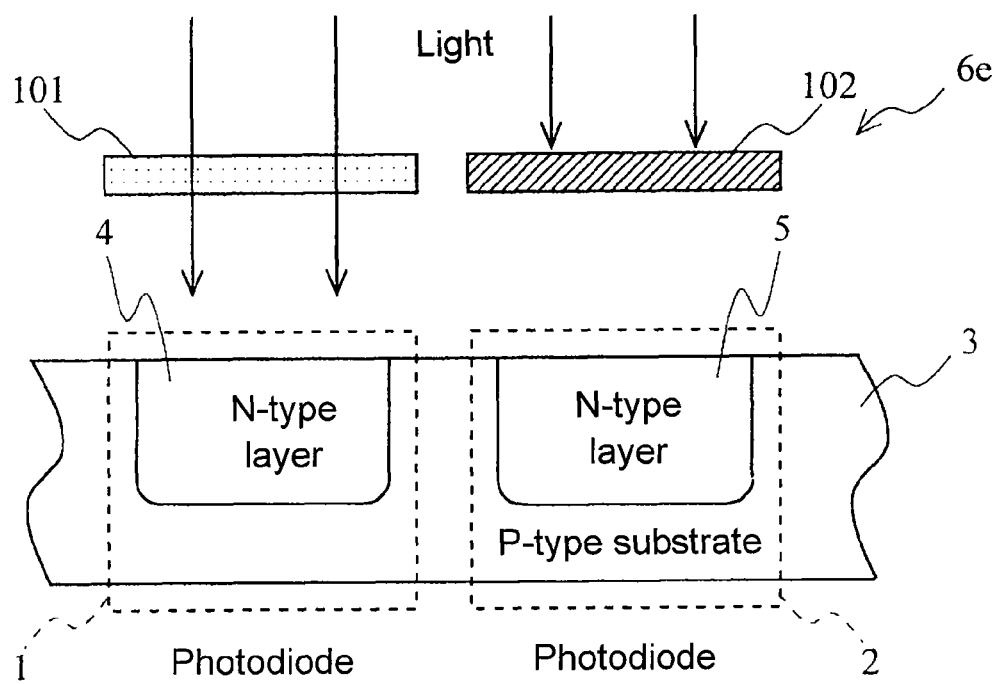
FIG. 16 is a diagram illustrating an example of a semiconductor device in which photodiodes are formed.

FIG. 16 is a diagram illustrating an example of a semiconductor device on which photodiodes used in this embodiment are formed.

A semiconductor device 6e is constructed in the same manner as the semiconductor device 6 in FIG. 1, is formed of, for example, single crystal silicon, and includes a p-type substrate 3 that is formed in p-type, and n-type layers 4 and 5 which are n-type regions.

The n-type layers 4 and 5 are formed with predetermined depths from a front surface of the p-type substrate 3, and the n-type layer 4 and the n-type layer 5 are formed to have the same depth.

Then, the n-type layer 4 and the p-type substrate 3 constitute a photodiode 1, and the n-type layer 5 and the p-type substrate 3 constitute a photodiode 2.

The photodiodes 1 and 2 have the same spectral characteristic because of the same structure.

An optical filter 101 for blocking infrared light and ultraviolet light is provided above the photodiode 1. A light shield layer 102 for blocking infrared light, ultraviolet light, and visible light is provided above the photodiode 2.

Light incident on the photodiode 1 is filtered by the optical filter 101 and thus visible light obtained by removing infrared light and ultraviolet light reaches the light receiving surface of the photodiode 1.

In contrast to this, light (infrared light, ultraviolet light, and visible light) incident on the photodiode 2 is blocked by the light blocking layer 102 and thus may not reach the light receiving surface of the photodiode 2.

The reason why the photodiode 2 on which light is not incident is provided in the semiconductor device 6e as described above is to remove a dark electric charge noise generated in the photodiode 1.

That is, the photodiodes 1 and 2 have the same structure, including the same N-type layer depth, and hence the same dark electric charge is generated.

Therefore, when light is detected by the photodiode 1, the dark electric charge generated as a noise in the photodiode 1 is equal to the dark electric charge generated in the photodiode 2. Thus, when the dark electric charge generated in the photodiode 2 is subtracted from the electric charge generated in the photodiode 1, the electric charge generated in the photodiode 1 by incident light may be obtained.

Figure 17:
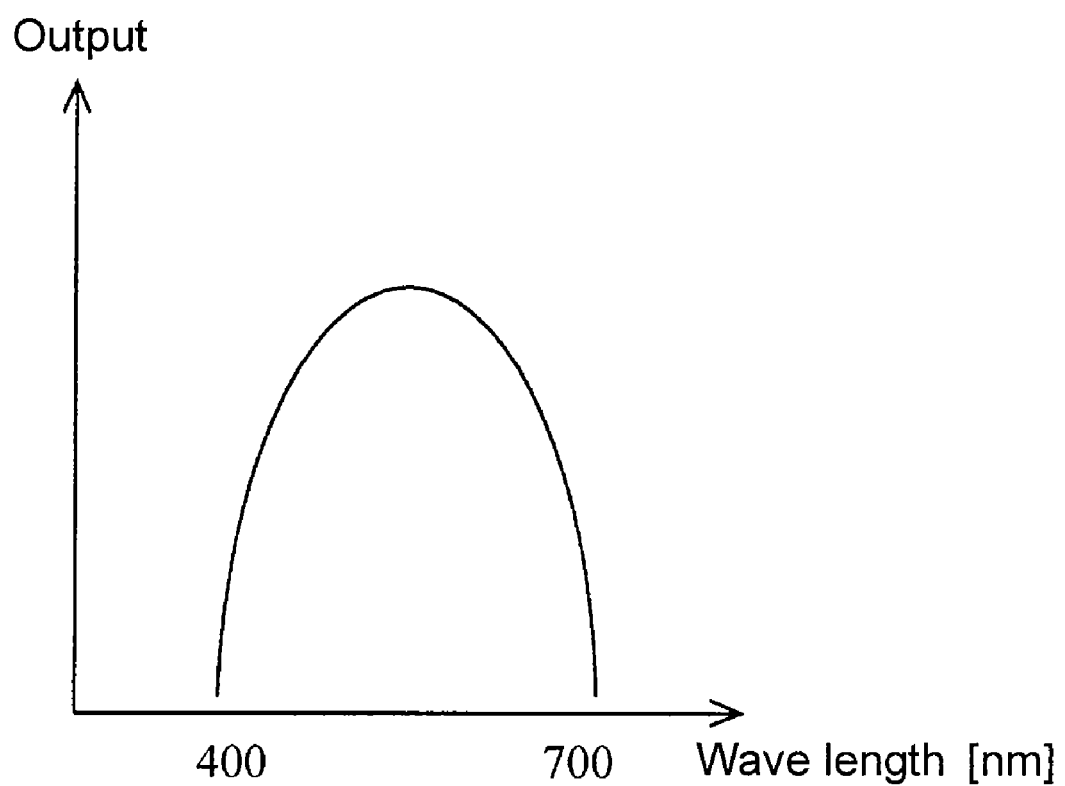
FIG. 17 is a graph schematically illustrating a spectral characteristic based on a difference between photodiodes.

FIG. 17 is a graph schematically illustrating a spectral characteristic by using a difference between the photodiodes 1 and 2. FIG. 17 is a schematic graph for illustrating the concept, and therefore does not necessarily strictly illustrate the spectral characteristic.

The axis of ordinate represents an output (current, voltage, or the like) which is generated by the photodiodes, and the axis of abscissa represents the wavelength of incident light. It is assumed that the light intensity of incident light is constant.

The visible light is incident on the photodiode 1 through the optical filter 101 to generate the electric charge based on the visible light and the dark electric charge. When the dark electric charge generated in the photodiode 2 is subtracted from the generated electric charge, the electric charge based on the incident visible light is obtained.

When a voltage corresponding to the electric charge is measured, as illustrated in FIG. 17, sensitivity is obtained in a visible light region of approximately 400 [nm] to 700 [nm].

As described above, the output of the photodiode 1 is obtained based on light passing through the optical filter 101. Therefore, for example, when the optical filter 101 is provided to transmit ultraviolet light and block other light, the semiconductor device 6e may be used as an ultraviolet sensor. When the optical sensor is provided to transmit infrared light and block other light, the semiconductor device 6e may be used as an infrared sensor.

That is, when the optical filter 101 is provided to transmit light of a wavelength to be observed, the semiconductor device may be used as a sensor for detecting light of a desired wavelength band.

The structure of the photodetection device 10 using the semiconductor device 6e is the same as illustrated in FIG. 3.

When the optical filter 101 is provided above the light receiving surface of the photodiode 1 illustrated in FIG. 3 and the light shield layer 102 is provided above the light receiving surface of the photodiode 2, the photodetection device 10 using the semiconductor device 6e is obtained.

The operation of the photodetection device 10 using the semiconductor device 6e is the same as in the case of FIG. 3 and thus the description is omitted here.

The structures of the photodetection device 10 and the semiconductor device 6e are described above. In the semiconductor device 6e, the optical filter 101 functions as first light shield means for blocking light other than incident light of a desired wavelength and the light shield layer 102 functions as second light shield means for blocking (all) incident light.

Therefore, in the semiconductor device 6e, the photodiode 1 and the optical filter 101 function as a first light receiving element provided with the first light shield means for blocking the light other than the incident light of the desired wavelength, and the photodiode 2 and the light shield layer 102 function as a second light receiving element provided with the second light shield means for blocking the incident light.

In the photodetection device 10 using the semiconductor device 6e, the electric charges are stored in the photodiodes 1 and 2 by the switches 17 and 18, and hence the photodetection device 10 includes storage means for causing the first light receiving element and the second light receiving element to store the electric charges generated therein.

In the photodetection device 10 using the semiconductor device 6e, the incident light is output from the differential circuit 15 as the difference between the amounts of electric charges stored in the photodiodes 1 and 2, and hence the photodetection device 10 includes difference acquisition means for acquiring the difference between the amounts of electric charges stored in the first light receiving element and the second light receiving element, and output means for outputting the difference as the amount of electric charges corresponding to the incident light of the desired wavelength.

The photodiodes 1 and 2 have the same structure, and hence the first light receiving element and the second light receiving element have the same light-receiving and electric charge-storing characteristics.

As described above, the storage means of the photodetection device 10 using the semiconductor device 6e causes predetermined electrodes (cathode terminals) of the first light receiving element (photodiode 1) and the second light receiving element (photodiode 2) to be electrically opened to store the electric charges.

The predetermined electrodes of the first light receiving element and the second light receiving element are connected, through the predetermined switches (switches 17 and 18), a constant voltage source (direct-current power supply) 19 for resetting the electric charges stored in the light receiving elements. The storage means turns off the switches to electrically open the predetermined electrodes.

The difference acquisition means (differential circuit 15) acquires the difference between the stored electric charges based on the voltage difference between the predetermined electrodes (cathode terminals) of the first light receiving element (photodiode 1) and the second light receiving element (photodiode 2). The photodetection device 10 includes reset means for resetting the electric charges stored in the first light receiving element and the second light receiving element by turning on the switches 17 and 18 to connect the predetermined electrodes (cathode terminals) of the first light receiving element (photodiode 1) and the second light receiving element (photodiode 2) to the predetermined constant voltage source (direct-current power supply 19).

Further, the following may be considered.

That is, in the semiconductor device 6e, the photodiode 2 is provided to remove the dark electric charge noise generated in the photodiode 1 to improve detection precision of the photodiode 1, and hence the visible light is detected by the photodiode 1.

Therefore, the precision is degraded as compared with the case where the photodiode 2 is used, but the photodiode 1 and the optical filter 101 may be used to detect the visible light without using the photodiode 2.

In this case, the amount of the electric charge stored in the photodiode 1 is detected by the photodetection device 10 (voltage corresponding to an electric charge stored in photodiode 1 is output from differential circuit 15 because photodiode 2 is not provided). The amount of an electric charge is used as a detection value.

In this case, when the semiconductor device 6e excluding the photodiode 2 is applied to the photodetection device 10, the photodetection device may include the light receiving element (photodiode 1) for generating an electric charge by incident light, the storage means for causing the light receiving element to store the generated electric charge, and the output means for outputting the amount of the electric charge corresponding to the incident light of the desired wavelength which is stored in the storage means.

A structure may be employed in which the light shield means (optical filter 101) for blocking light other than the incident light of the desired wavelength which is incident on the light receiving element is provided and the output means outputs the amount of the electric charge stored in the storage means as the amount of the electric charge corresponding to the incident light of the desired wavelength.

This case is the same as the photodetection device 10 using the semiconductor device 6e in the point that the storage means (switch 17) causes the predetermined electrode (cathode terminal) of the light receiving element (photodiode 1) to be electrically opened to store the electric charge, in the point that the predetermined electrode of the light receiving element is connected, through the predetermined switch (switch 17), to the constant voltage source (direct-current power source) 19 for resetting the electric charge stored in the light receiving element and the storage means turns off the switch to electrically open the predetermined electrode, and in the point that the reset means for resetting the electric charge stored in the light receiving element by connecting the predetermined electrode of the light receiving element to the predetermined constant voltage source is provided.

Each of FIG. 4 is an explanatory diagram illustrating a case where the photodiodes 1 and 2 of the semiconductor device 6e saturate.

The photodiode 1 rapidly stores the electric charge when received light is stronger. Therefore, when illuminance is large, there may be a case where the output of the photodiode 1 saturates before the illuminance determination unit 12 detects the output of the differential circuit 15, and hence a correct value may not be measured.

FIG. 4(a) is a schematic graph for illustrating a case in which the output of the photodiode 1 is saturated at the time of reset.

First, when the switches 17 and 18 turn off after the photodiodes 1 and 2 are connected to the direct-current power supply 19 (FIG. 2) to set the voltages at the cathode terminals to the reference voltage, the voltages at the cathode terminals decreases as illustrated in FIG. 4(*a*).

Light passing through the optical filter 101 is incident on the photodiode 1, but light is not incident on the photodiode 2 because of the light shield layer 102. Therefore, the voltage drop in the photodiode 1 is more rapid than that in the photodiode 2.

Figure 18A:
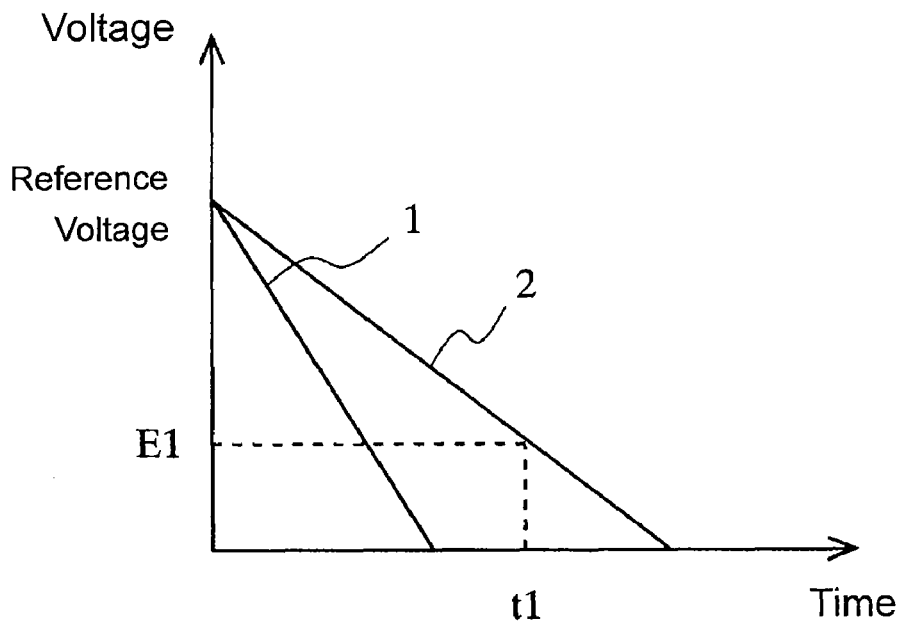
FIG. 18A is a schematic graphs illustrating saturation of outputs of the photodiodes.
Figure 18B:
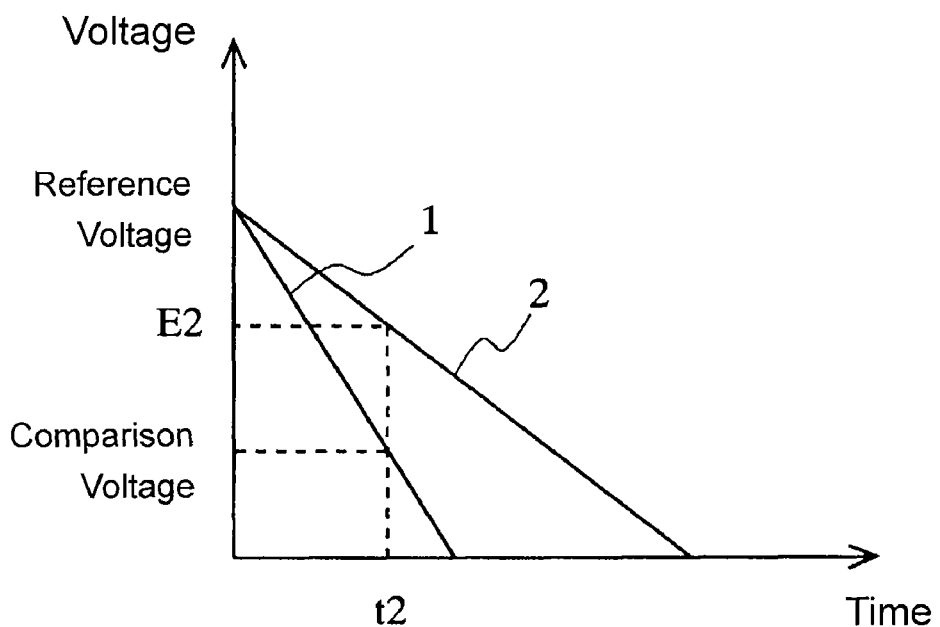
FIG. 18B is a schematic graph illustrating prevention of saturation by a reset.

In FIG. 18(*a*), because the light intensity is large, the output of the photodiode 1 is saturated before reaching a reset time t1.

When it is assumed that the illuminance determination unit 12 detects the output of the differential circuit 15 immediately before reset, E1 that is a voltage corresponding to the dark electric charge is detected in the photodiode 2 at the reset time t1, but a detection value corresponding to the light intensity may not be obtained in the photodiode 1 because the output is saturated.

As illustrated in FIG. 18(*b*), when the voltage across the photodiode 1 reaches a predetermined comparison voltage, reset is executed.

In an example of FIG. 18(*b*), reset is executed at a time t2 when the photodiode 1 becomes a comparison voltage, and in this case, the voltage across the photodiode 2 becomes E2.

For this reason, the photodiode 1 may output the voltage corresponding to the light intensities.

In order to perform the operation as described above, the semiconductor device 6*e* is desirably incorporated in the photodetection device 10*a* illustrated in FIG. 5.

FIG. 5 illustrates the structure in which the voltage of the photodiode 2 is compared with the comparison voltage of the direct-current power supply 22. However, in the case of the semiconductor device 6*e*, the voltage of the photodiode 1 is compared with the comparison voltage, and hence the photodiode 1 and the photodiode 2 are interchanged in FIG. 5.

The photodetection device 10*a* in which the semiconductor device 6*e* is incorporated is operated as described above with reference to FIG. 5.

Therefore, changing means for changing an electric charge storage time of the storage means based on the light intensity may be provided.

In the case where the semiconductor device 6*e* is applied to the photodetection device 10*b* illustrated in FIG. 6, only when the difference between the photodiodes 1 and 2 is detected for determination by the illuminance determination unit 12, the photodiodes may be intermittently driven to save power consumption.

In this case, the photodetection device 10*b* is operated as described above with reference to FIG. 6.

Therefore, driving means (timer clock 31) for driving the difference acquisition means (differential circuit 15) at a timing in which the difference is output from the difference output means may be provided.

When the photodetection device 10*c* illustrated in FIG. 7 is applied to the semiconductor device 6*e*, the influence of flicker of the light source may be reduced.

In this case, the photodetection device 10*c* is operated as described above with reference to FIG. 7.

Therefore, reduction means (integration circuit 41) for reducing a variation occurring in difference output from the difference output means (differential circuit 15) due to a variation in intensity of light emitted from the light source may be provided.

Figure 19:
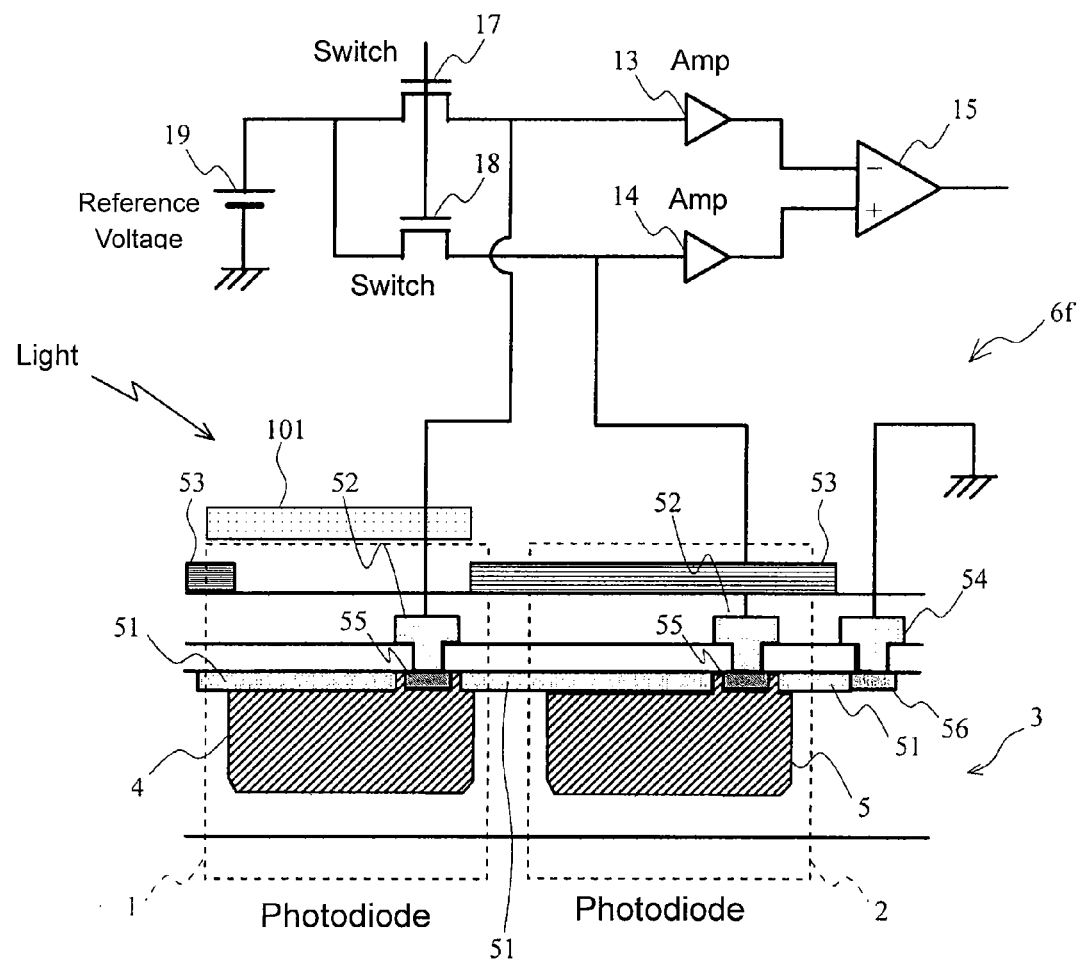
FIG. 19 is an explanatory diagram illustrating an example in which an electromagnetic wave noise is shielded.

In addition, as illustrated in FIG. 19, thin film electrodes having light transparency may be provided on the photodiode to shield the photodiode from an electromagnetic wave noise from outside.

FIG. 19 is a diagram illustrating the configuration of a semiconductor device 6*f* according to this embodiment, and corresponds to FIG. 8.

It should be noted that the same configurations as those of FIG. 8 are denoted by identical reference numerals, and a description thereof is simplified or omitted.

The semiconductor device 6*f* is a photodetection semiconductor device in which the n-type layers 4 and 5 are formed on the p-type substrate 3 as in the semiconductor device 6*e*.

In this example, the photodiode 1 functions as a first light receiving element that is formed of a semiconductor substrate (p-type substrate 3) formed of a first conductivity type (p-type in this example) semiconductor and a first conductive layer (n-type layer 4) formed of a second conductive type (n-type in this example) semiconductor which is formed with a predetermined depth from a surface of the semiconductor substrate, and the photodiode 2 functions as a second light receiving element formed of a semiconductor substrate (p-type substrate 3) and a second conductive layer (n-type layer 5) formed of a second conductivity type semiconductor which is formed with a predetermined depth from the surface of the semiconductor substrate.

Thin film p-type layers 51, 51, . . . are formed on upper surfaces of the n-type layers 4 and 5.

The p-type layers 51 have a transparency with respect to light to be detected, and shields the electromagnetic waves.

As described above, electromagnetic wave shield layers (p-type layers 51) that transmit light and have the conductivity are formed on the surfaces of the first conductive layer (n-type layer 4) and the second conductive layer (n-type layer 5).

The p-type layers 51 may more effectively exhibit the shield function by grounding.

Aluminum wirings 52 and 52, which are connected to the n-type layers 4 and 5, are connected to the n-type layers 4 and 5 through n+ layers 55 with high concentration of n-type, respectively.

Wiring through-holes are provided in the p-type layers 51, and the aluminum wirings 52 are formed in the through-holes.

Further, the p-type substrate 3 is connected to an aluminum wiring 54 through a p+ layer 56 with high concentration of p-type, and is grounded.

Light shield aluminums 53, 53, . . . are formed in regions of the light receiving surface in which the photodiodes are not formed and above the photodiode 2, to block incident light.

Therefore, in this example, the light shield aluminums 53 function as the light shield layer 102.

The optical filter 101 is provided above the photodiode 1 to obtain the desired spectral characteristic.

The semiconductor device 6*e* or the photodetection device 10, which has the structure as described above, may be used to adjust luminance of a liquid crystal screen of a cellular phone.

In this case, the brightness of visible light in the outside world is measured by the photodetection device 10. For example, when the outside world is bright, the luminance of the screen is reduced. When the outside world is dark, the luminance of the screen is increased.

Therefore, there may be provided an image display device which includes image display means for displaying an image, brightness determination means for determining the brightness of the outside world based on the output of the photodetection device, and luminance adjustment means for adjusting the luminance of the image display means based on the determined brightness.

As described above, the following digital output photodetection circuit may be applied to the semiconductor device 6*e* to provide a photodetection device.

(First Configuration) A digital output photodetection circuit including: a light receiving element (at least one of the photodiode 1 provided with the optical filter 101 and the photodiode 2 provided with the light shield layer 102) for generating an electric charge based on received light; storage means for causing the light receiving element to store the generated electric charge; clock signal generation means for generating a clock signal; count value generation means for generating a count value corresponding to an amount of the stored electric charge by associating the amount of the stored electric charge with the generated clock signal; and count value output means for outputting the generated count value.

(Second Configuration) The digital output photodetection circuit according to the first configuration, in which the count value generation means generates the number of clock signals which are generated until the stored electric charge changes to a predetermined value from an initial value as the count value.

(Third Configuration) The digital output photodetection circuit according to the first configuration, further including reset means for resetting the stored electric charge to an initial value every time the amount of the stored electric charge reaches a predetermined amount, in which the count value generation means generates the number of times of resetting by the reset means during a predetermined period of time measured by the clock signal as the count value.

(Fourth Configuration) A photodetection device using the digital output photodetection circuit according to any one of the first, second, or third configuration, the photodetection device including: count value acquisition means for acquiring a first count value corresponding to an amount of an electric charge stored in the first light receiving element, and a second count value corresponding to an amount of an electric charge stored in the second light receiving element having a spectral characteristic different from a spectral characteristic of the first light receiving element; differential operation means for calculating a difference between the acquired first count value and the acquired second count value in a digital manner; and a difference output means for outputting the calculated difference as a digital value.

(Fifth Configuration) An image display device including: the photodetection device according to the fourth configuration; image display means for displaying an image; brightness determination means for determining brightness of an outside world based on an output from the digital output photodetection circuit; and luminance adjustment means for adjusting luminance of the image display means based on the determined brightness.

The second embodiment of the photodetection device described above may provide the following effects.

(1) When the optical filter 101 which transmits the visible light to be observed and blocks the other light is provided for the photodiode 1, the electric charge corresponding to the visible light may be stored in the photodiode 1 and obtained as an output voltage.

(2) When the photodiode 2 having the same structure as the photodiode 1 is formed to block all light entering the photodiode 2, the dark electric charge equal to the dark electric charge generated in the photodiode 1 may be generated.

(3) When the voltage difference is obtained between the photodiodes 1 and 2, the influence of the dark electric charge generated in the photodiode 1 may be cancelled to provide the desired spectral characteristic.

(4) The photodiodes 1 and 2 have the same structure, and hence manufacturing is easy and a manufacturing cost may be reduced.

(5) When the spectral characteristic of the optical filter 101 is suitably set, a photodetection device may be provided for various light and used as, for example, an ultraviolet sensor.

What is claimed is:

1. A photodetection device, comprising:
   a first light receiving element for generating an electric charge based on received light;
   a second light receiving element having a spectral characteristic different from a spectral characteristic of the first light receiving element, for generating an electric charge based on received light;
   storage means for causing the first light receiving element and the second light receiving element to store the generated electric charges;
   difference acquisition means for acquiring a difference between the electric charges stored in the first light receiving element and the second light receiving element; and
   difference output means for outputting the acquired difference, further comprising reduction means for reducing a variation caused in the difference output from the difference output means by a variation in intensity of light emitted from a light source.

2. A photodetection device according to claim 1, wherein the storage means causes predetermined electrodes of the first light receiving element and the second light receiving element to be electrically opened, to store the electric charges.

3. A photodetection device according to claim 2, wherein:
   the predetermined electrodes of the first light receiving element and the second light receiving element are connected, through predetermined switches, to a constant voltage source for resetting the electric charges stored in the light receiving elements; and
   the storage means turns off the predetermined switches to electrically open the predetermined electrodes.

4. A photodetection device according to claim 2, wherein the difference acquisition means acquires the difference between the stored electric charges based on a voltage difference between the predetermined electrodes of the first light receiving element and the second light receiving element.

5. A photodetection device according to claim 2, wherein the photodetection device comprises reset means for resetting the electric charges stored in the first light receiving element and the second light receiving element by connecting the predetermined electrodes of the first light receiving element and the second light receiving element to a predetermined constant voltage source.

6. A photodetection device according to claim 1, further comprising driving means for driving the difference acquisition means at a timing at which the difference is output from the difference output means.

7. A photodetection device according to claim 1, further comprising changing means for changing electric charge storage time of the storage means based on intensity of light.

8. An image display device, comprising:
   the photodetection device according to claim 1;
   image display means for displaying an image;
   brightness determination means for determining brightness of an outside world based on an output from the photodetection device; and
   luminance adjustment means for adjusting luminance of the image display means based on the determined brightness.

* * * * *